(12) United States Patent
Adachi et al.

(10) Patent No.: US 7,646,136 B2
(45) Date of Patent: Jan. 12, 2010

(54) PIEZOELECTRIC ELEMENT, VIBRATORY ACTUATOR AND DRIVE UNIT

(75) Inventors: Yusuke Adachi, Osaka (JP); Hideaki Mukae, Hyogo (JP); Masaru Higashionji, Osaka (JP); Eiichi Nagaoka, Hyogo (JP)

(73) Assignee: Panasonic Corporation, Kadoma (JP)

(*) Notice: Subject to any disclaimer, the term of this patent is extended or adjusted under 35 U.S.C. 154(b) by 80 days.

(21) Appl. No.: 12/115,063

(22) Filed: May 5, 2008

(65) Prior Publication Data

US 2008/0278033 A1 Nov. 13, 2008

(30) Foreign Application Priority Data

May 7, 2007 (JP) ............................. 2007-122282
May 7, 2007 (JP) ............................. 2007-122286

(51) Int. Cl.
*H01L 41/04* (2006.01)
*H01L 41/08* (2006.01)

(52) U.S. Cl. .................................. 310/323.16; 310/366
(58) Field of Classification Search ............ 310/323.04, 310/323.16, 363–366
See application file for complete search history.

(56) References Cited

U.S. PATENT DOCUMENTS

| 7,005,776 | B1* | 2/2006 | Iino et al. ............... 310/316.01 |
| 7,061,159 | B2* | 6/2006 | Funakubo .............. 310/323.12 |
| 7,362,036 | B2* | 4/2008 | Sasaki .................... 310/323.16 |
| 7,514,843 | B2* | 4/2009 | Nagahama et al. .......... 310/317 |
| 7,545,085 | B2* | 6/2009 | Adachi ........................ 310/365 |
| 2004/0189155 | A1* | 9/2004 | Funakubo .................... 310/366 |
| 2008/0278032 | A1* | 11/2008 | Adachi et al. ................ 310/317 |
| 2008/0278033 | A1* | 11/2008 | Adachi et al. ................ 310/317 |

FOREIGN PATENT DOCUMENTS

| JP | 04-234661 | 8/1992 |
| JP | 10-217454 | 8/1998 |
| JP | 2728980 | 12/1999 |
| JP | 2000-152670 | 5/2000 |
| JP | 2002-027594 | 1/2002 |
| JP | 2003-501988 | 1/2003 |
| JP | 2004-158163 | 6/2004 |
| JP | 2004-297951 | 10/2004 |
| JP | 2006-187112 | 7/2006 |
| WO | 00/74153 | 12/2000 |

* cited by examiner

*Primary Examiner*—J. SanMartin
(74) *Attorney, Agent, or Firm*—Renner, Otto, Boisselle & Sklar, LLP

(57) ABSTRACT

A piezoelectric element is formed by stacking piezoelectric layers and internal electrode layers. The internal electrode layers are positive and negative electrode layers. The positive electrode layers are first and second positive electrode layers. The negative electrode layers are first and second negative electrode layers. Each of the first positive and negative electrode layers includes four divided electrodes and a connecting electrode for connecting a pair of the four divided electrodes formed on diagonally opposite two areas along a first diagonal direction on a principle surface of the associated one of the piezoelectric layers. Each of the second positive and negative electrode layers includes four divided electrodes and a connecting electrode for connecting a pair of the four divided electrodes formed on diagonally opposite two areas along a second diagonal direction on a principle surface of the associated one of the piezoelectric layers.

8 Claims, 15 Drawing Sheets

PIEZOELECTRIC ELEMENT, VIBRATORY ACTUATOR AND DRIVE UNIT

CROSS-REFERENCE TO RELATED APPLICATION

The disclosure of Japanese Patent Application No. 2007-122282 filed on May 7, 2007 and Japanese Patent Application No. 2007-122286 filed on May 7, 2007 including specifications, drawings and claims, is incorporated herein by reference in its entirety.

BACKGROUND OF THE INVENTION

1. Field of the Invention

The present invention relates to a piezoelectric element, a vibratory actuator including the piezoelectric element, and a drive unit including the vibratory actuator.

2. Description of the Prior Art

A vibratory actuator has been conventionally known which is for use in various electronic devices or other devices and includes a piezoelectric element (electromechanical transducer) (see, for example, Patent Document 1). This piezoelectric element is obtained by alternately stacking piezoelectric bodies and electrodes. For the vibratory actuator, the piezoelectric element is vibrated by applying voltages to the electrodes, thereby moving a movable body.

Patent Document 1: Japanese Translation of PCT International Application No. 2003-501988

A vibratory actuator needs two-phase power. A piezoelectric element of a vibratory actuator normally includes a piezoelectric body, and a feeding electrode and a common electrode which are independently provided to have two different phases, respectively. If the piezoelectric element is a single plane type piezoelectric element in which electrodes are formed on both surface of a single layer piezoelectric body and which has a thickness of several millimeters (mm), a voltage of several tens to several hundreds of volts has to be applied to sufficiently displace the piezoelectric element.

In recent years, the thickness of each piezoelectric body between electrodes is reduced by alternately stacking piezoelectric bodies and electrodes. Accordingly, even with the same magnitude of supply voltage, a voltage (field intensity) which is applied to each piezoelectric body per unit length is increased, thereby reducing a driving voltage.

However, for example, to realize 3 volt (V) driving using a lithium ion power supply, which has been used as a power source for recent cellular phones, the thickness of the piezoelectric body has to be reduced to several tens of micrometers ($\mu m$) or less. However, with such a small thickness of the piezoelectric body, a piezoelectric constant is reduced and the ratio of electrodes to the piezoelectric body is increased, thus resulting in reduction in efficiency.

In view of the efficiency and the number of devices for use, as a piezoelectric element driving method, a half bridge driving scheme or a single driving scheme is used in general. Either of those schemes allows only application of a voltage corresponding to a difference between a ground level and a power supply level to the piezoelectric element.

Using a full bridge driving scheme or a push-pull driving scheme, a reverse voltage of the power supply voltage can be applied to the piezoelectric element. Thus, even when a voltage of the same magnitude is applied thereto, twice the magnitude of voltage can be applied.

However, in a known vibratory actuator having a common electrode, a power supply circuit such as a full bridge circuit, a push-pull circuit and the like which is capable of applying a reverse voltage can not be used.

As a possible solution to this problem, a common electrode is divided. However, if each common electrode is merely divided, eight connection points with external electrodes, wires and the like are needed at an outer surface (for example, a surrounding surface) of a piezoelectric element. This causes deterioration of the properties of the piezoelectric element due to the weight of wires and the like.

Furthermore, with divided common electrodes provided, when a connecting electrode for connecting the external electrodes with one another is formed at the outer surface (for example, the surrounding surface) of the piezoelectric element, the number of the connection points can be reduced to four. However, in this case, an electrode has to be formed at each edge portion of the piezoelectric element (by so-called edge connection) and, when the piezoelectric element is brought in contact with peripheral equipment thereof, the electrode provided at the edge portion comes off or like problems arise. This results in reduction in reliability thereof.

In view of the above-described problems, the present invention has been devised and it is therefore an object of the present invention to allow full bridge driving in a piezoelectric element, a vibratory actuator and a driving unit while achieving improved reliability thereof.

SUMMARY OF THE INVENTION

To solve the above-described problems, the present invention provides a piezoelectric element formed by alternately stacking substantially rectangular piezoelectric layers and internal electrode layers and characterized in that the internal electrode layers are positive electrode layers and negative electrode layers which are alternately arranged in a stacking direction with each of the piezoelectric layers interposed between an associated one of the positive electrode layers and an associated one of the negative electrode layers, the positive electrode layers include a first positive electrode layer provided on a principle surface of one of the piezoelectric layers and a second positive electrode layer provided on a principle surface of different one of the piezoelectric layers from the one of the piezoelectric layers in which the first positive electrode layer is provided, the negative electrode layers include a first negative electrode layer provided on a principle surface of one of the piezoelectric layers and a second negative electrode layer provided on a principle surface of different one of the piezoelectric layers from the one of the piezoelectric layers in which the first negative electrode layer is provided, each of the first positive electrode layer and the first negative electrode layer includes four divided electrodes provided in four areas, respectively, the four areas being obtained by dividing a principle surface of an associated one of the piezoelectric layers into two areas in a lengthwise direction and two areas in a widthwise direction, and a connecting electrode for connecting a pair of the divided electrodes formed on diagonally opposite two of the four areas along a first diagonal direction on the principle surface of the associated one of the piezoelectric layers, and each of the second positive electrode layer and the second negative electrode layer includes four divided electrodes provided in the four areas, respectively, and a connecting electrode for connecting a pair of the divided electrodes formed on diagonally opposite two of the four areas along a second diagonal direction on the principle surface of the associated one of the piezoelectric layers.

According to another aspect of the present invention, a plurality of piezoelectric elements are electrically connected in series. Specifically, according to this aspect, provided is a drive unit characterized by including a vibratory actuator including a plurality of piezoelectric elements, driver elements provided on the piezoelectric elements and a single movable body supported by the driver elements of the piezoelectric elements; and a control unit for supplying a first voltage and a second voltage having a same frequency as a frequency of the first voltage and a shifted phase relative to a phase of the first voltage to each of the piezoelectric elements to cause each of the piezoelectric elements to make composite vibration of stretching vibration and bending vibration so that the driver element makes a substantially elliptical motion due to the composite vibration, thereby moving the movable body, and characterized in that the vibratory actuator includes first through nth piezoelectric elements (where n is an arbitrary integer of 2 or more) as the plurality of piezoelectric elements, each of the piezoelectric elements is formed by alternately stacking piezoelectric layers and internal electrode layers, the internal electrode layers are positive electrode layers and negative electrode layers which are alternately arranged in a stacking direction with each of the piezoelectric layers interposed between an associated one of the positive electrode layers and an associated one of the negative electrode layers, each of the positive electrode layers includes first positive electrodes and second positive electrodes, each of the negative electrode layers includes first negative electrodes provided so that each of the first negative electrodes is opposed to an associated one of the first positive electrodes with an associated one of the piezoelectric layers interposed therebetween and the first voltage is supplied between each of the first negative electrodes and an associated one of the first positive electrodes and second negative electrodes provided so that each of the second negative electrodes is opposed to an associated one of the second positive electrodes with an associated one of the piezoelectric layers interposed therebetween, the second voltage is supplied between each of the second negative electrodes and an associated one of the second positive electrodes and the second negative electrodes are not electrically connected to the first negative electrodes, a first negative electrode of an ith piezoelectric element (where i=1, . . . and i=n−1) and a first positive electrode of an (i+1)th piezoelectric element are electrically connected to each other, and a second negative electrode of the ith piezoelectric element and a second positive electrode of the (i+1)th piezoelectric element are electrically connected to each other.

According to the present invention, an inverted voltage can be applied to a piezoelectric element, thereby allowing full bridge driving in the piezoelectric element. Also, a plurality of piezoelectric elements can be connected in series, thus allowing the piezoelectric elements to be operated in a cooperated manner. In the inventive structure, edge connection is not necessary, so that the reliability of the piezoelectric element is improved.

DESCRIPTION OF THE PREFERRED EMBODIMENTS

Embodiments of the present invention will be described hereinafter in detail with reference to the accompanying drawings.

Embodiment 1

Structure of Vibratory Actuator

Figure 1:
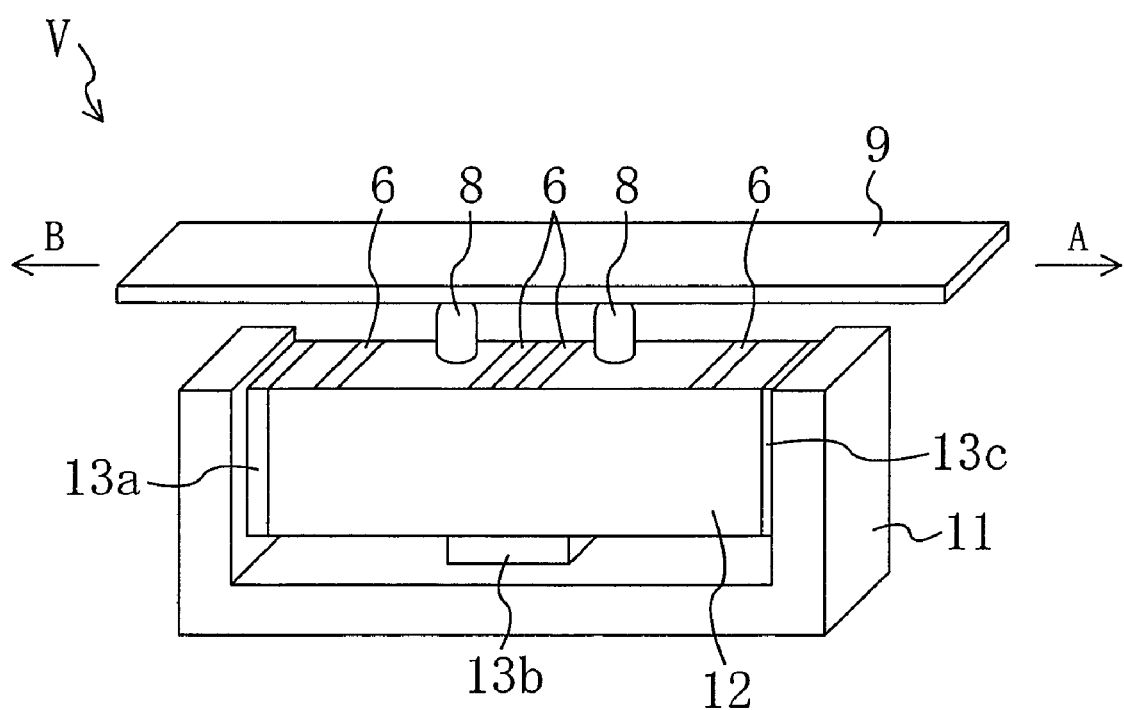
FIG. 1 is a perspective view of a vibratory actuator.
Figure 2:
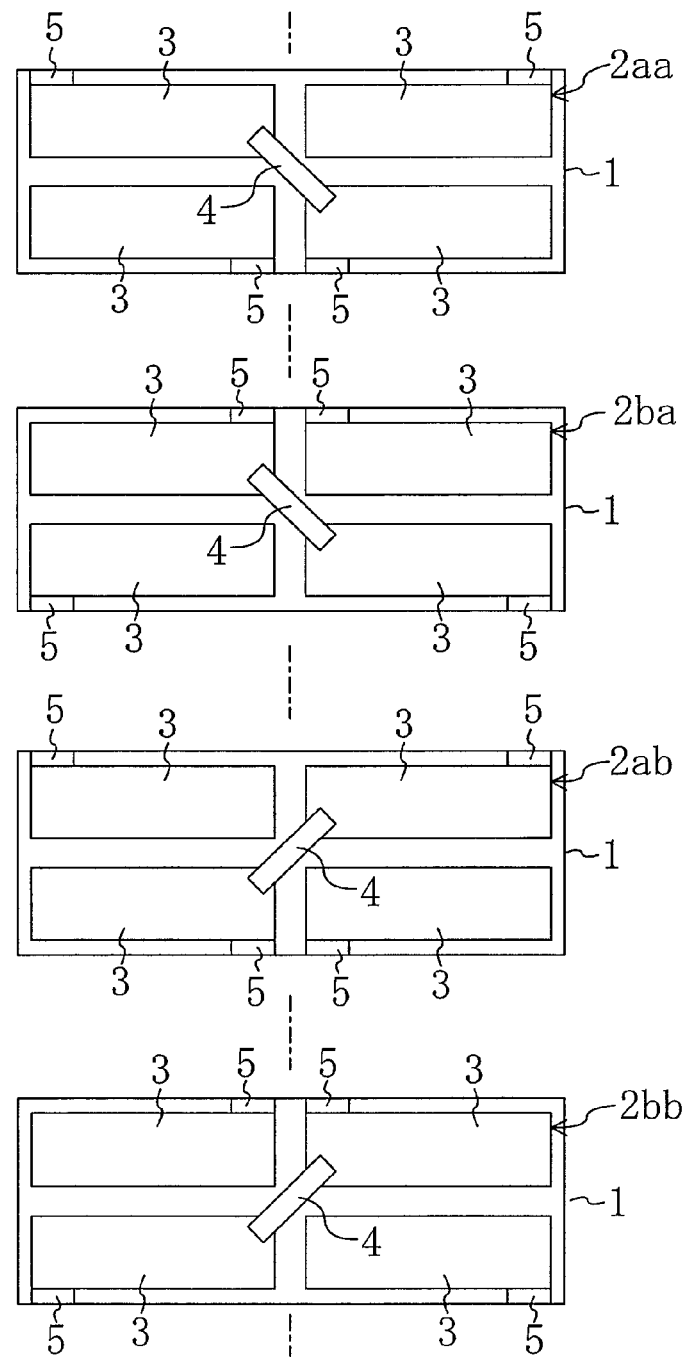
FIG. 2A is a perspective view of a piezoelectric element.
FIG. 2B shows plan views of piezoelectric layers with electrode layers provided on their upper principle surfaces, respectively.

As shown in FIG. 1 and FIG. 2, a vibratory actuator V according to this embodiment of the present invention includes a substantially rectangular parallelepiped piezoelectric element 12 (for example, with a length of 6.0 mm×a width of 1.7 mm×a thickness of 1.0 mm). The piezoelectric element 12 has a pair of opposed principle surfaces, a pair of opposed end surfaces which are perpendicular to the principle surfaces and extend in the lengthwise direction of each principle surface of the piezoelectric element 12, and a pair of opposed side surfaces which are perpendicular to both the principle and end surfaces and extend in the widthwise direction of each principle surface thereof. The principle, end and side surfaces form the outer surfaces of the piezoelectric element 12, and the end and side surfaces form the surrounding surfaces thereof. In this embodiment, the principle surfaces each have the largest area among the principle, end and side surfaces.

The piezoelectric element 12 is contained inside a case 11 and supported by the case 11 with three supporting members 13a through 13c interposed therebetween. Driver elements 8 are provided on one of the end surfaces of the piezoelectric element 12. The driver elements 8 support a flat movable body 9. The driver elements 8 and the movable body 9 are formed of a ceramic material containing as a major component, for example, zirconia, alumina or silicon nitride. The supporter 13b, which is disposed on the other end surface of the piezoelectric element 12 (the end surface opposite to the end surface on which the driver elements 8 are provided), presses the driver elements 8 against the movable body 9. This press increases the friction force between the distal ends of the driver elements 8 and the movable body 9, whereby vibration of the piezoelectric element 12 is reliably transmitted to the movable body 9 through the driver elements 8.

The piezoelectric element 12 is formed by alternately stacking substantially rectangular piezoelectric layers 1 and internal electrode layers 2. Each of the piezoelectric layers 1 is an insulating layer made of a piezoelectric ceramic material containing as a major component, for example, lead zirconium titanate.

The internal electrode layers 2 are electrode layers made of metal containing as a major component, for example, silver or palladium. Each of the internal electrode layers 2 includes four divided electrodes 3 provided in four areas obtained by dividing an upper principle surface of each of the piezoelectric layers into quadrants with two areas in the lengthwise direction and two areas in the widthwise direction. A connecting electrode 4 connects a pair of the divided electrodes 3 formed on the diagonally opposite two of the four areas along either one of the diagonal directions on an upper principle surface of an associated one of the piezoelectric layers 1 and lead electrodes 5 extend to reach an end surface of the piezoelectric element 12. The divided electrodes 3 are connected to divided electrodes 3 provided on another internal electrode layer 2 and having the same potential applied thereto via the lead electrodes 5 and external connecting electrodes (external feeding electrodes) 6, respectively. The external connecting electrodes 6 are electrodes made of metal containing as a major component, for example, silver or palladium. It is preferable that four external connecting electrodes 6 are formed on each of the two end surfaces of the piezoelectric element 12 and are disposed with a distance equal to or larger than a thickness of each of the piezoelectric layers 1 between one another. Power is, then, supplied to the divided electrodes 3 via the external connecting electrodes 6, the lead electrodes 5 and the connecting electrode 4.

The internal electrode layers 2 are positive electrode layers 2a and negative electrode layers 2b which are alternately arranged in the stacking direction of layers (in the thickness direction of the piezoelectric element 12) with each of the piezoelectric layers 1 interposed between an associated one of the positive electrode layers 2a and an adjacent one of the negative electrode layers 2b. The positive electrode layers 2a and the negative electrode layers 2b are insulated from one another and not conductive therethrough. Specifically, the positive electrode layers 2a are first positive electrode layers 2aa, each being formed on an upper principle surface of an associated one of the piezoelectric layers 1, and second positive electrode layers 2ab, each being formed on an upper principle surface of one of the piezoelectric layers 1 different from the piezoelectric layers 1 on which each of the first positive electrode layers 2aa is formed. The negative electrode layers 2b are first negative electrode layers 2ba, each being formed on an upper principle surface of an associated one of the piezoelectric layers 1, and second negative electrode layers 2bb, each being formed on an upper principle surface of one of the piezoelectric layers 1 different from the piezoelectric layers 1 on which each of the first positive electrode layers 2ba is formed. The internal electrode layers 2 are formed by repeatedly stacking a first positive electrode layer 2aa, a first negative electrode layer 2ba, a second positive electrode layer 2ab and a second negative electrode layer 2bb in this order in the stacking direction of the layers with each of the piezoelectric layers 1 interposed between an associated one of the positive electrode layers 2a and an adjacent one of the negative electrode layers 2b. Each of the piezoelectric layers 1 is polarized from an associated one of the positive electrode layers 2a to an associated one of the negative electrode layers 2b.

Figure 3:
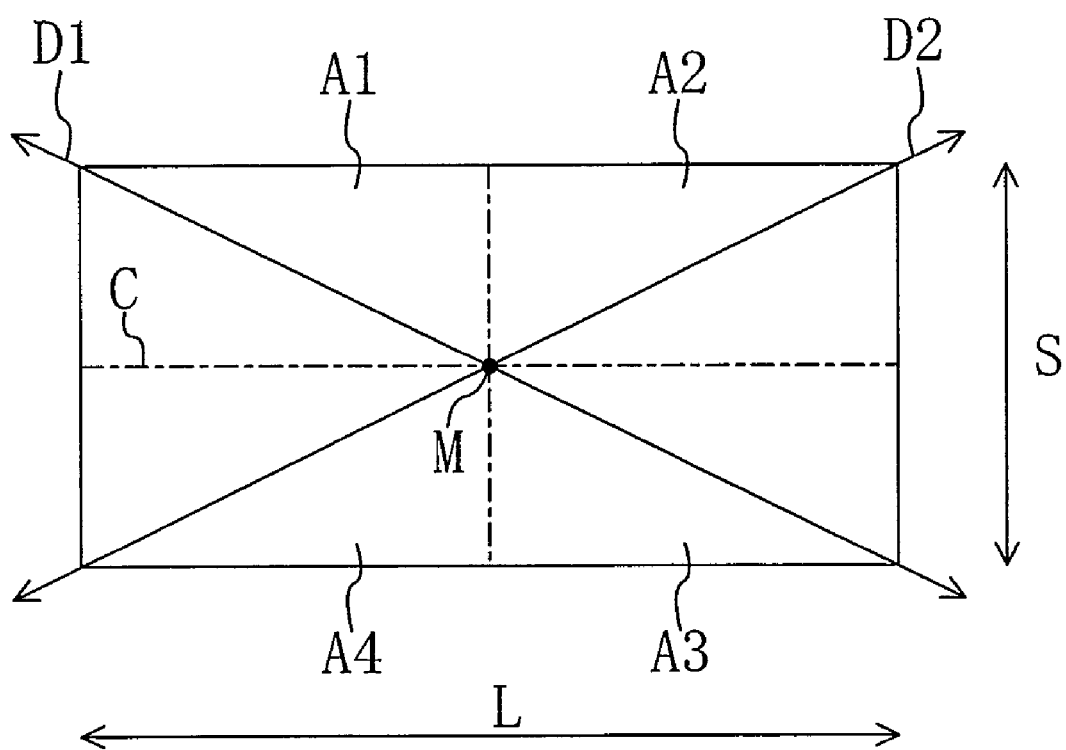
FIG. 3 is a plan view illustrating an upper principle surface of a piezoelectric layer.

Hereafter, the first positive electrode layers 2aa will be described. Suppose that an upper principle surface of each of the piezoelectric layers 1 is divided in four areas A1 through A4 (see FIG. 3), i.e., two areas in the lengthwise direction L and two areas in the widthwise direction S. The four divided electrodes 3 of each of the first positive electrode layers 2aa are provided in the four areas A1 through A4, respectively, and the connecting electrode 4 provides electrical conduction between a pair of the divided electrodes 3 formed on the diagonally opposite two areas A1 and A3 along the first diagonal direction (the direction in which a first diagonal line extends) D1 on the upper principle surface of the piezoelectric layer 1. The divided electrodes 3 of the first positive electrode layers 2aa are substantially rectangular electrodes and overlap with the divided electrodes 3 of an associated one of the negative electrode layers 2b which is an adjacent thereto when viewed in the stacking direction. That is, the divided electrodes 3 of each of the first positive electrode layers 2aa are opposed to the divided electrodes 3 of an associated one of the negative electrode layers 2b with an associated one of the piezoelectric layers 1 interposed therebetween. Each of the divided electrodes 3 is provided with a lead electrode 5 extending to an end surface of the piezoelectric element 12. The lead electrodes 5 do not overlap with the divided electrodes 3 of each of the negative electrode layers 2b when viewed from the stacking direction. That is, the lead electrodes 5 of each of the first positive electrode layers 2aa are not opposed to the divided electrodes 3 of an associated one of the negative electrode layers 2b. Thus, an electric field is not generated in part of each of the piezoelectric layers 1 opposed to an associated one of the lead electrodes 5, which means that this part is piezoelectrically inactive.

Following is the description of the second positive electrode layers 2ab. The four divided electrodes 3 of each of the first positive electrode layers 2ab are provided in the four areas A1 through A4, respectively, and the connecting electrode 4 provides conduction between a pair of the divided electrodes 3 formed on the diagonally opposite two areas A2 and A4 along the second diagonal direction (the direction in which a second diagonal line extends) D2 on an upper principle surface of an associated one of the piezoelectric layers 1. Each of the divided electrodes 3 is provided with a lead electrode 5 extending to an end surface of the piezoelectric element 12. The lead electrodes 5 are provided at locations corresponding to the locations of the lead electrodes 5 of the first positive electrode layers 2aa. The divided electrodes 3 of each of the first positive electrode layers 2aa provided in the areas A1 and A3 are conductive with the divided electrodes 3 of each of the second positive electrode layers 2ab provided in the areas A1 and A3 via the external connecting electrodes 6. The divided electrodes 3 of each of the first positive electrode layers 2aa provided in the areas A2 and A4 are conductive with the divided electrodes 3 of each of the second positive electrode layers 2ab provided in the areas A2 and A4 via the external connecting electrodes 6. In other points, the second positive electrode layers 2ab are substantially the same as the first positive electrode layers 2aa.

The negative electrode layers 2*b* will be described. The four divided electrodes 3 of each of the first negative electrode layers 2*ba* are also provided in the four areas A1 through A4, respectively, and, as in the first positive electrode layers 2*aa*, the connecting electrode 4 provides conduction between a pair of the divided electrodes 3 formed on the diagonally opposite two areas A1 and A3 along the first diagonal direction D1 on an upper principle surface of an associated one of the piezoelectric layers 1. Each of the divided electrodes 3 is provided with a lead electrode 5 extending to an end surface of the piezoelectric element 12. The four divided electrodes 3 of each of the second negative electrode layers 2*bb* are also provided in the four areas A1 through A4, respectively, and, as in the second positive electrode layers 2*ab*, the connecting electrode 4 provides conduction between a pair of the divided electrodes 3 formed on the diagonally opposite two areas A2 and A4 along the second diagonal direction D2 on an upper principle surface of an associated one of the piezoelectric layers 1. Each of the divided electrodes 3 is provided with a lead electrode 5 extending to an end surface of the piezoelectric element 12. The lead electrodes 5 are provided at corresponding locations to the locations of the lead electrodes 5 of the first negative electrode layers 2*ba*. The divided electrodes 3 of each of the first negative electrode layers 2*ba* provided in the areas A1 and A3 are conductive with the divided electrodes 3 of each of the second negative electrode layers 2*bb* provided in the areas A1 and A3 via the external connecting electrodes 6. The divided electrodes 3 of each of the first negative electrode layers 2*ba* provided in the areas A2 and A4 are conductive with the divided electrodes 3 of each of the second negative electrode layers 2*bb* provided in the areas A2 and A4 via the external connecting electrodes 6. That is, the divided electrodes 3 of each of the negative electrode layers 2*b* provided in the areas A1 and A3 are not electrically connected to the divided electrodes 3 of each of the negative electrode layers 2*b* provided in the areas A2 and A4. In other points, the positive electrode layers 2*b* are substantially the same as the positive electrode layers 2*a*.

With adoption of the above-described electrode structure, when power is supplied to the four external connecting electrodes 6 provided on one of the end surfaces of the piezoelectric element 12, power can be supplied to each of the four independent divided electrodes 3 in the areas A1 through A4. Suppose that the external connecting electrodes 6 connected to the divided electrodes 3 of each of the positive electrode layers 2*a* provided in the areas A1 and A3, respectively, are referred to as A+, the external connecting electrodes 6 connected to the divided electrodes 3 of each of the positive electrode layers 2*a* provided in the areas A2 and A4, respectively, are referred to as B+, the external connecting electrodes 6 connected to the divided electrodes 3 of each of the negative electrode layers 2*b* provided in the areas A1 and A3, respectively, are referred to as A− and the external connecting electrodes 6 connected to the divided electrodes 3 of each of the negative electrode layers 2*b* provided in the areas A2 and A4 are referred to as B−. With application of a voltage between A+ and A− and between B+ and B− on one of the end surfaces of the piezoelectric element 12, an electric field can be applied to parts of the piezoelectric layers 1 corresponding to the areas A1 and A3 and parts of the piezoelectric layers 1 corresponding to the areas A2 and A4.

Resonance frequencies of stretching vibration and bending vibration of the piezoelectric element 12 are determined by the material, shape and the like of the piezoelectric element 12. The material, shape and the like of the piezoelectric element 12 are determined so that the resonance frequencies of stretching vibration and bending vibration substantially coincide. In this embodiment, the material, shape and the like of the piezoelectric element 12 are determined so that the resonance frequency of the first mode of stretching vibration and the resonance frequency of the second mode of bending vibration coincide.

Hereafter, the internal electrode layers 2 and the like will be further described.

The divided electrodes 3 are connected to the external connecting electrodes 6 via the lead electrodes 5 located in piezoelectrically inactive parts, respectively. Thus, excessive vibration does not occur in the piezoelectric element 12. As a result, the piezoelectric element 12 is vibrated in a balanced manner, thus improving the vibration efficiency of the piezoelectric element 12.

The internal electrode layers 2 are formed by repeatedly stacking a first positive electrode layer 2*aa*, a first negative electrode layer 2*ba*, a second positive electrode layer 2*ab* and a second negative electrode layer 2*bb* in this order in the stacking direction with an associated one of the piezoelectric layers 1 interposed between adjacent internal electrode layers 2. Thus, the symmetry property of vibration in part of the piezoelectric element 12 in which the connecting electrode 4 is located is improved. Accordingly, excessive vibration does not occur in the piezoelectric element 12 and energy loss can be largely reduced. As a result, supplied power can be efficiently converted into vibration.

The same number of first positive electrode layers 2*aa*, second positive electrode layers 2*ab*, first negative electrode layers 2*ba* and second negative electrode layers 2*bb* are provided. Thus, the symmetry property of vibration in the piezoelectric element 12 is improved. Accordingly, excessive vibration does not occur in the piezoelectric element 12 and energy loss can be largely reduced. As a result, supplied power can be efficiently converted into vibration.

The piezoelectric element 12 is formed so as to have the piezoelectric layers 1 as its outermost layers in the stacking direction. This results in the following effects. Suppose that a small vibratory actuator V (for example, having a length of about 1 mm to 20 mm) is mounted in a very small space in an electronic device and the piezoelectric element 12 is formed so as to have the internal electrode layers 2 as its outermost layers. In this case, when a principle surface of the piezoelectric element 12 is in touch with peripheral metal equipment provided around the piezoelectric element 12, an electrode layer of the outermost layers might be short-circuited and the properties of the vibratory actuator V might be markedly reduced. However, as described above, with use of the piezoelectric layers 1 of insulator as the outermost layers the piezoelectric element 12 in the stacking direction, even if a principle surface of the piezoelectric element 12 is in touch with metal equipment, a short circuit does not occur. Accordingly, the reliability of the vibratory actuator V can be improved.

—Operation of Vibratory Actuator—

Figure 4:
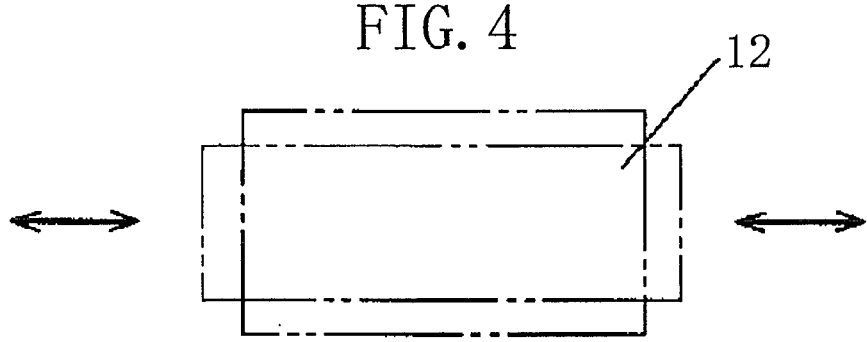
FIG. 4 is a displacement diagram of a first mode of stretching vibration.
Figure 5:
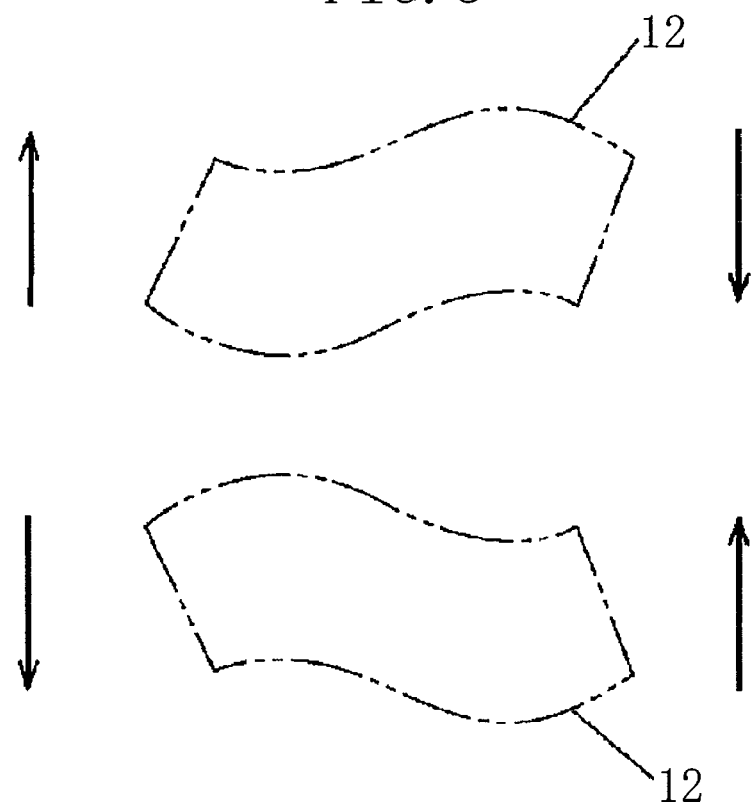
FIG. 5 is a displacement diagram of a second mode of bending vibration.
Figure 6A:
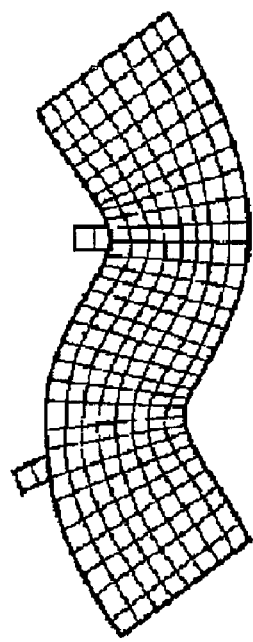
FIGS. 6A through 6D are conceptual diagrams illustrating the operation of the piezoelectric element.
Figure 6B:
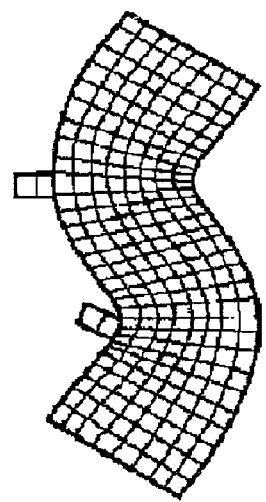
Figure 6C:
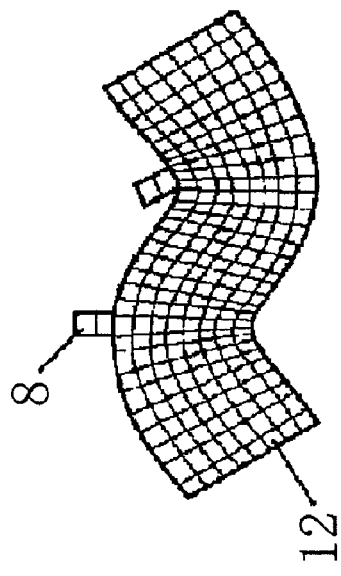
Figure 6D:
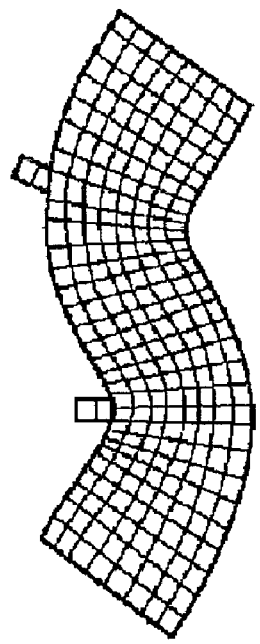

Hereafter, the operation of the vibratory actuator V will be described. FIG. 4 is a displacement diagram of the first mode of stretching vibration. FIG. 5 is a displacement diagram of the second mode of bending vibration. FIGS. 6A through 6D are conceptual diagrams illustrating the operation of the piezoelectric element 12. In FIG. 4, FIGS. 5A and 5B, and FIGS. 6A through 6D, it is supposed that the principle surface of the piezoelectric element 12 is parallel to the page of each drawing.

As an example, a reference AC voltage (hereafter referred to as a "first voltage") which is a sine wave having a frequency around the resonance frequency is applied between A+ and A− (i.e., each of the divided electrodes 3 of each of the positive electrode layers 2*a* provided in the areas A1 and A3 and an associated one of the divided electrodes 3 of an associated one of the negative electrode layers 2b provided in the areas A1 and A3) via a wire (not shown). In addition, an AC voltage (hereafter referred to as a "second voltage") which is a sine wave having substantially the same magnitude and the same frequency as that of the first voltage is applied between B+ and B− (i.e., the divided electrodes 3 of each of the positive electrode layers 2a provided in the areas A2 and A4 and the divided electrodes 3 of each of the negative electrode layers 2b provided in the areas A2 and A4) via a wire (not shown). Accordingly, a voltage having the same phase is applied to the divided electrodes 3 of the positive electrode layers 2a provided in the areas A1 and A3 and also a voltage having the same phase is applied to the divided electrodes 3 of the positive electrode layers 2a provided in the areas A2 and A4. As a result, if a phase difference between the first voltage and the second voltage is 0°, the first mode of stretching vibration of FIG. 4 is induced in the piezoelectric element 12, and if the phase difference is 180°, the second mode of bending vibration of FIG. 5 is induced in the piezoelectric element 12.

When the first voltage in the form of a sine wave at a frequency around the resonance frequency is applied between A+ and A− and the second voltage in the form of a sine wave having a phase shifted by 90° or −90° relative to the first voltage and having substantially the same magnitude and the same frequency is applied between B+ and B−, the first mode of stretching vibration of FIG. 4 and the second mode of bending vibration of FIG. 5 are induced in a cooperated manner in the piezoelectric element 12.

Then, the shape of the piezoelectric element 12 varies in the order shown in FIGS. 6A through 6D. As a result, the driver elements 8 provided in the piezoelectric element 12 make an elliptical motion when viewed in the direction normal to the page in FIGS. 6A through 6D. That is, the elliptical motion of the driver elements 8 is made by composite vibration of stretching vibration and bending vibration of the piezoelectric element 12. This elliptical motion causes a relative motion of the movable body 9 supported by the driver elements 8 with the piezoelectric element 12, whereby the movable body 9 moves in the directions shown by arrows A and B of FIG. 1.

In this case, the stretching direction of stretching vibration is along the lengthwise direction of the principle surfaces of the piezoelectric element 12, i.e., the movement direction of the movable body 9. The vibration direction of bending vibration is along the direction in which the driver elements 8 support the movable body 9. The stacking direction of the piezoelectric element 12 is perpendicular to the stretching direction of stretching vibration and also to the vibration direction of bending vibration.

Examples

Figure 7:
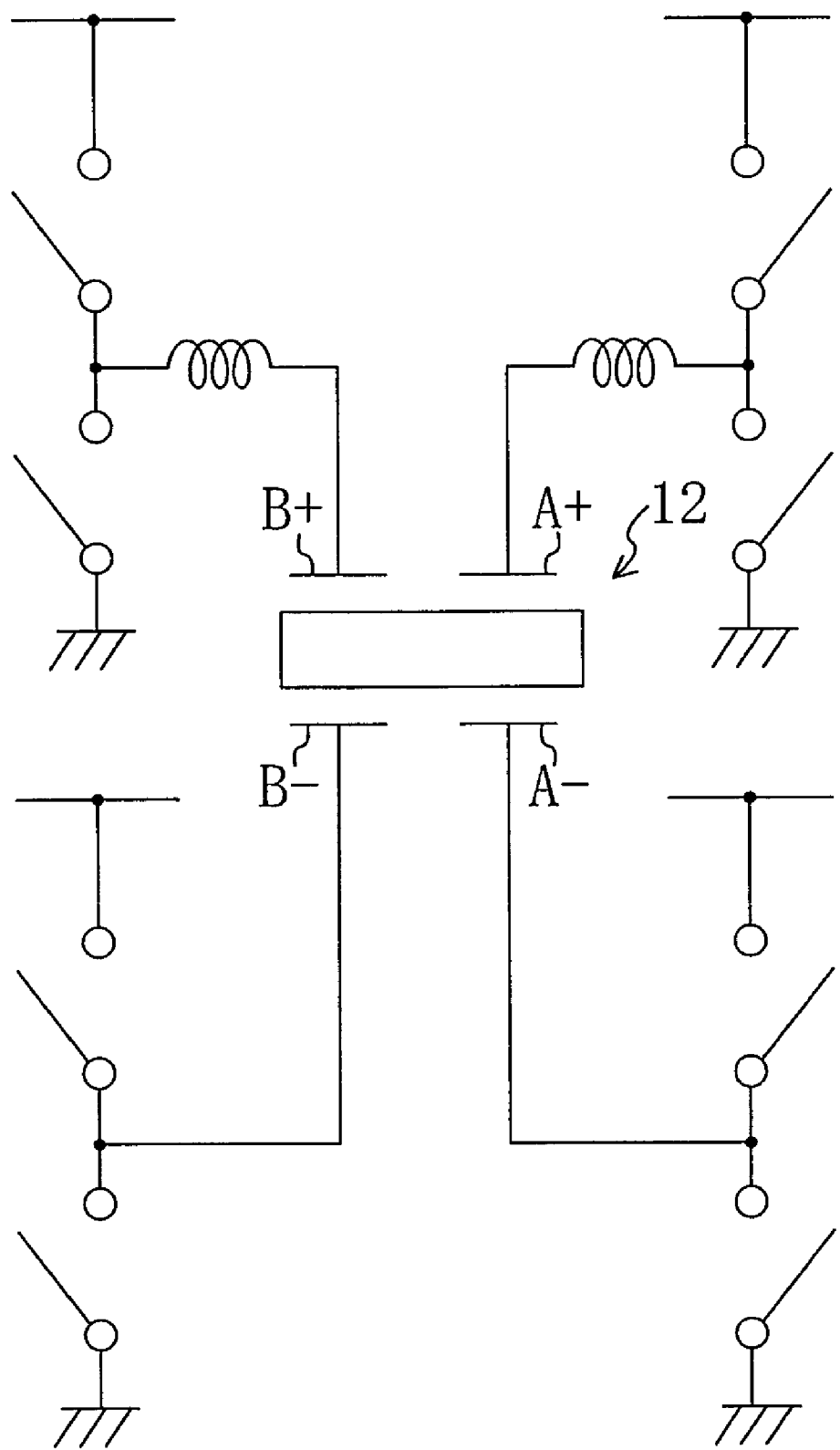
FIG. 7 is a circuit diagram of a drive unit for the piezoelectric element.

A full bridge drive unit having a power supply voltage of 3 V was provided for a vibratory actuator according to the present invention, as shown in FIG. 7. As a switching circuit, field-effect transistors (FETs) were used. By performing switching under the control of a CPU at 270 kHz, voltages of ±3 V were applied to the piezoelectric element 12. A gate signal from the FET to be applied between A+ and A− and a gate signal from the FET to be applied between B+ and B− were set to have the same frequency and a phase difference between the gate signals was set to be 90°. In this case, a voltage applied to the piezoelectric element 12 was 6 Vpp and the movement speed of the movable body 9 under an unloaded condition was 90 mm/s.

Figure 8:
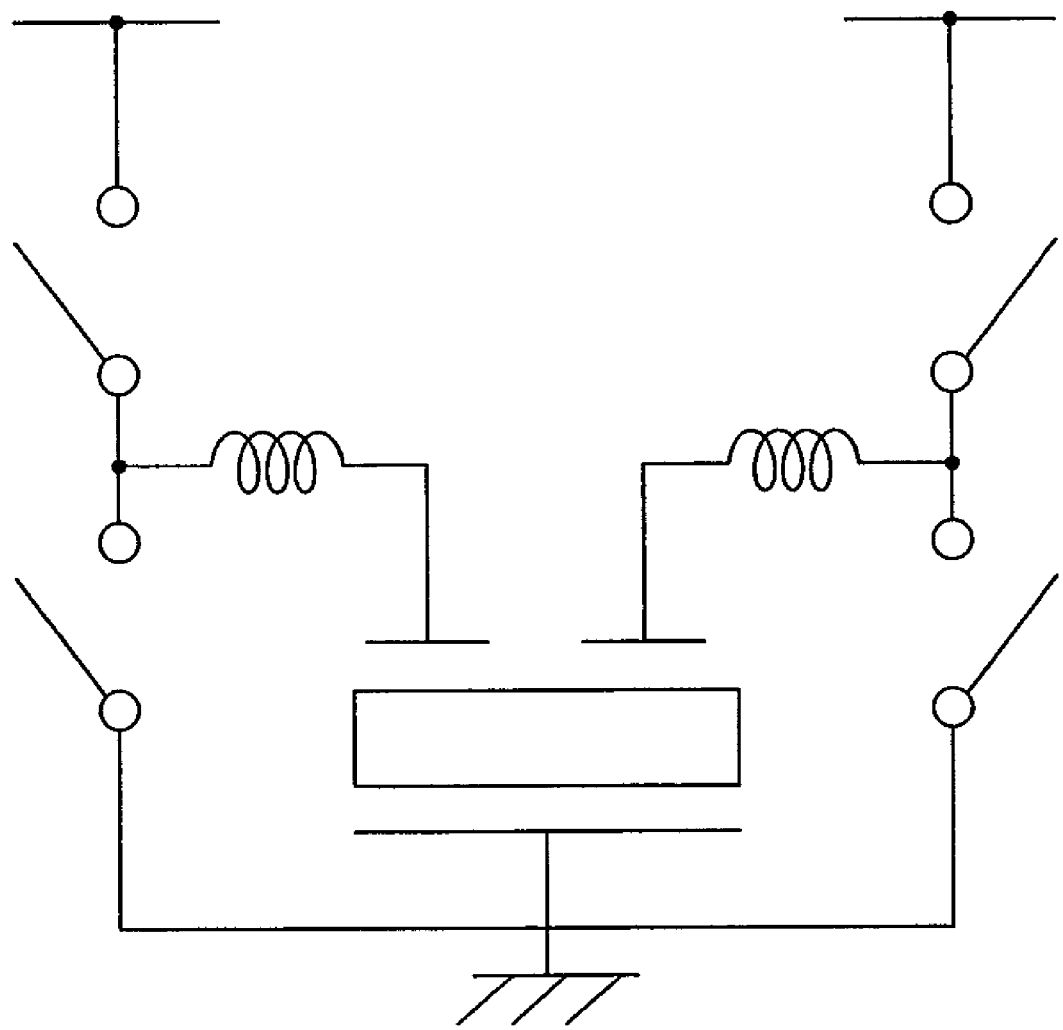
FIG. 8 is a circuit diagram of a drive unit for the piezoelectric element.

Under otherwise the same condition, a half bridge drive unit was provided for a known vibratory actuator including a common electrode, as shown in FIG. 8. In this case, a voltage applied to the piezoelectric element was 3 Vpp and the movement speed of the movable body 9 under an unloaded condition was 50 mm/s.

Embodiment 2

Figure 9:
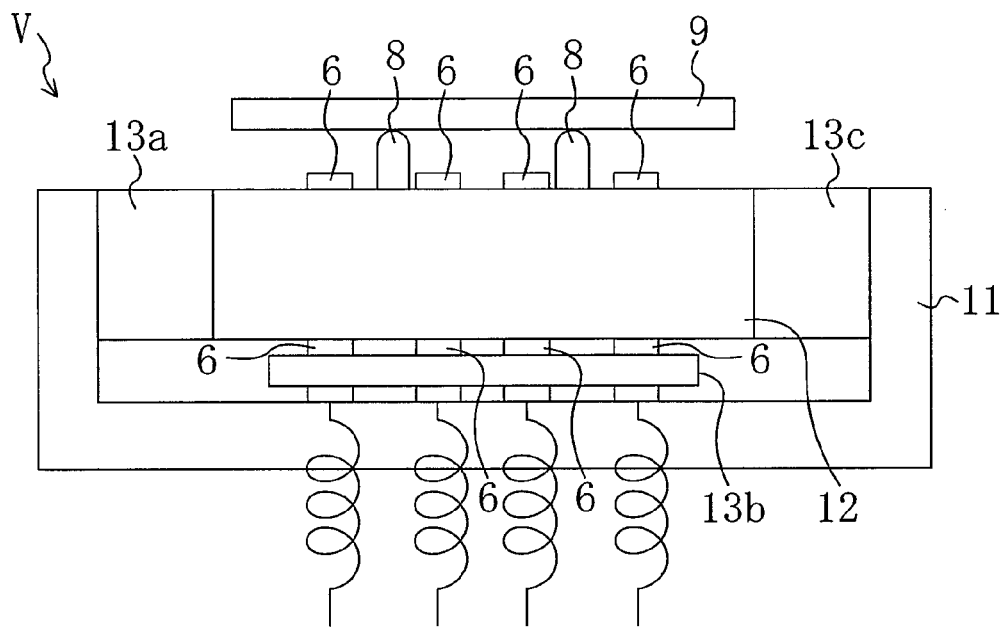
FIG. 9 is a front view of a vibratory actuator.

This embodiment is different from Embodiment 1 in that a vibratory actuator V has a different structure from that of Embodiment 1. As shown in FIG. 9, in this embodiment, driver elements 8 are mounted on one of the end surfaces of the piezoelectric element 12 so that each of the driver elements 8 is located at part corresponding to a loop of bending vibration wave. An electrically conductive rubber serving as the supporter 13b is provided, with the external connecting electrodes 6 interposed between the conductive rubber 13b and the piezoelectric element 12 on the end surface of the piezoelectric element 12 which is opposed to the end surface on which the driver elements 8 are mounted. The conductive rubber 13b is brought in conduction with a power supply terminal provided in the case 11. Precompression is applied to the conductive rubber 13b from a bottom side of the case 11, thereby applying a force to the piezoelectric element 12 via the conductive rubber 13b, whereby the driver elements 8 are pressed against the movable body 9.

The conductive rubber 13b has a laminated structure of, for example, a supporting layer containing silicon rubber as a major component and a conductive layer in which metal particles such as silver and the like are mixed in silicon rubber, is an anisotropic conductive rubber, and is electrically insulating in the stacking direction (the left-right direction of FIG. 9) so that the four external connecting electrodes 6 may remain electrically isolated from one another and respectively connected to four terminals via the conductive rubber 13b.

To achieve more accurate positioning of the principle surfaces of the piezoelectric element 12, rubber serving as supporters 13a and 13c may be provided on each side surface of the piezoelectric element 12.

Embodiment 3

Figure 10:
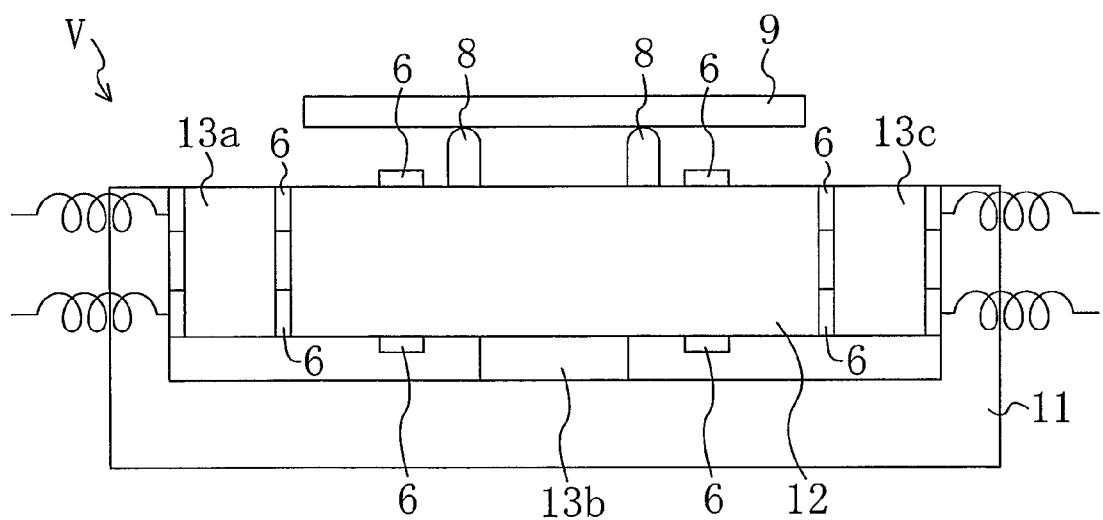
FIG. 10 is a front view of a vibratory actuator.
Figure 11A:
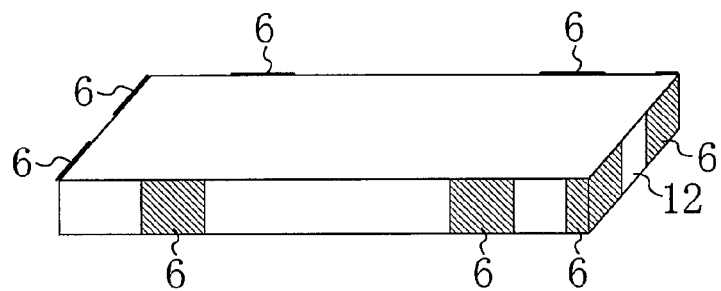
FIG. 11A is a perspective view of a piezoelectric element.
Figure 11B:
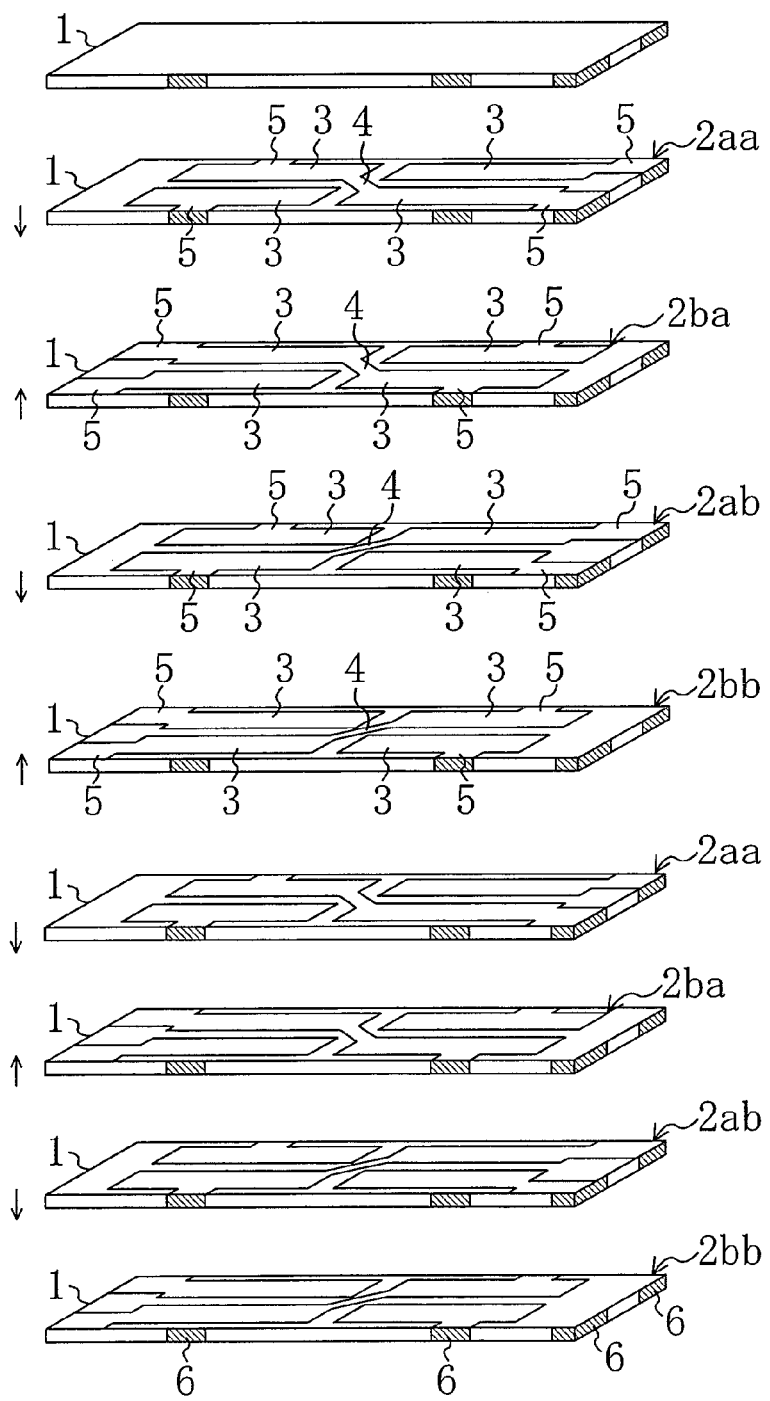
FIG. 11B is a perspective exploded view of the piezoelectric element.

This embodiment is different from Embodiment 1 in that a vibratory actuator V has a different structure from that of Embodiment 1. As shown in FIG. 10 and FIGS. 11A and 11B, in this embodiment, two external feeding electrodes 6 are formed on each side surface of the piezoelectric element 12 and two external connecting electrodes 6 are formed on each end surface of the piezoelectric element 12. Anisotropic conductive rubber, as the supporter 13a and the supporter 13c provides four electrically conductive paths which are electrically isolated in the up-down direction of FIG. 10 so as to maintain electrical isolation between respective pairs of external connecting electrodes 6. The conductive paths extend from the external connecting electrodes 6 on the side surfaces of the piezoelectric element 12 to corresponding power supply terminals in the case 11. Precompression is applied to rubber (supporter) 13b provided on a bottom surface (end surface) of the piezoelectric element 12.

In Embodiment 2, the external feeding electrodes 6 are formed on a lower end surface of the piezoelectric element 12 and the conductive rubber 13b serves as both a feeding terminal and precompression-application part. In the structure of Embodiment 2, if the vibratory actuator V is desired to be made into a high power vibratory actuator, a large precompression has to be applied thereto and, thus, precise application of precompression is required. Therefore, in Embodiment 2, there might be cases where a pressure applied to the conductive rubber 13*b* to achieve a stable conduction state does not coincide with a pressure required to be applied to the conductive rubber 13*b* for application of precompression.

In this embodiment, the external feeding electrodes 6 are formed on the side surfaces of the piezoelectric element 12 and power is supplied to the piezoelectric element 12 through the side surfaces, as shown in FIG. 10. Therefore, the conductive rubber 13*b* to which precompression is applied does not have to serve as a feeding terminal, so that the reliability of the vibratory actuator V can be improved.

Normally, each side surface of the piezoelectric element 12 is smaller than each end surface thereof and it is difficult to form two external feeding electrodes 6 with an insulation distance therebetween. However, as shown in FIG. 11, by allowing of the external feeding electrodes 6 to stick out into the side surfaces of the piezoelectric element 12 to a certain extent, an insulation distance between the two external feeding electrodes 6 can be ensured. Therefore, the two external connecting electrodes 6 are preferably formed on the end surfaces of the piezoelectric element 12 so as to be located as distant as possible from the side surfaces of the piezoelectric element 12, respectively.

Embodiment 4

This embodiment is different from Embodiment 1 in that a vibratory actuator V has a different structure from that of Embodiment 1.

—Structure of Vibratory Actuator—

Figure 12:
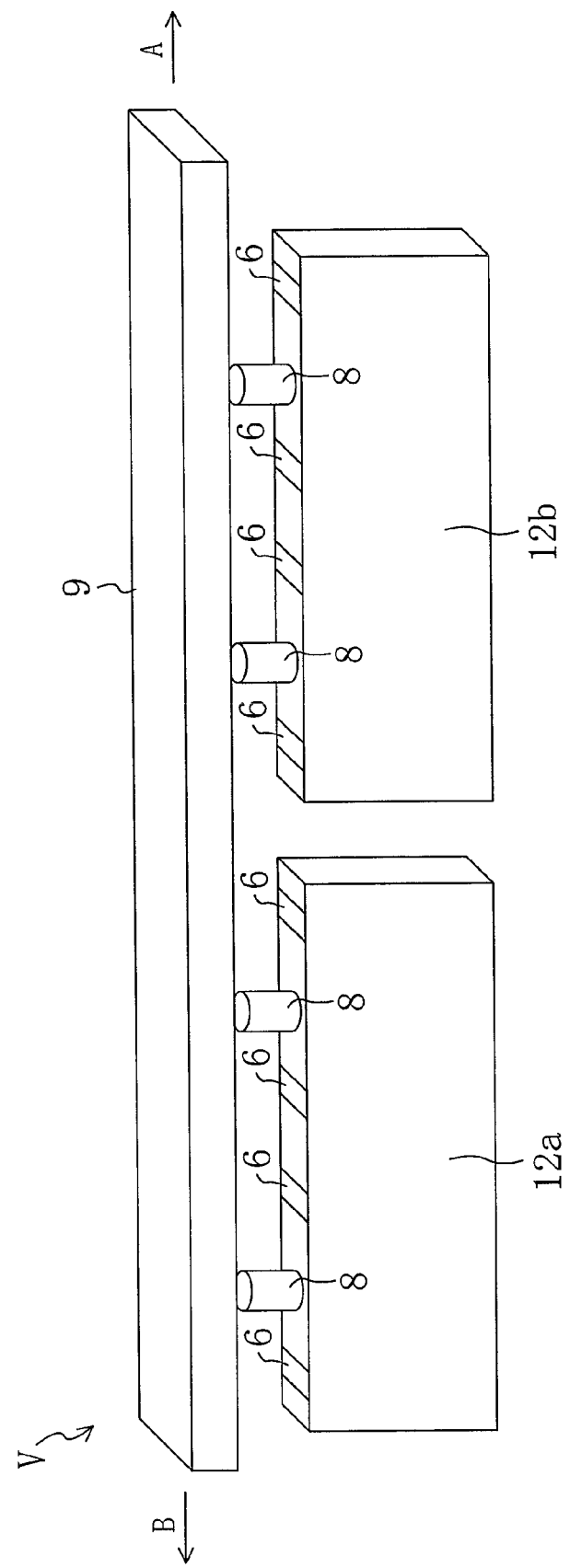
FIG. 12 is a schematic perspective view of a vibratory actuator.
Figure 13:
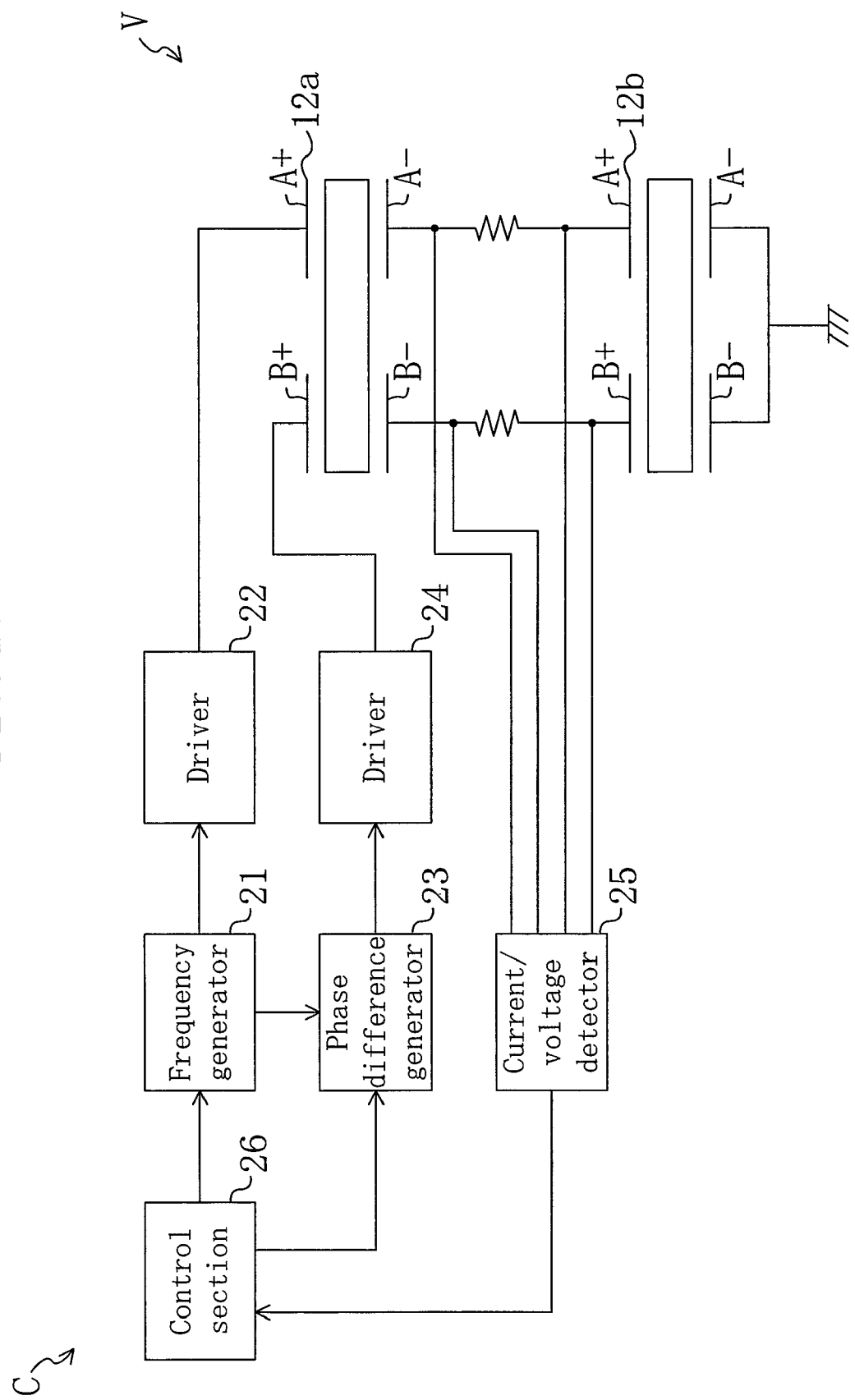
FIG. 13 is a block diagram of a control unit for a vibratory actuator.

As shown in FIG. 13, a drive unit according to this embodiment of the present invention includes a vibratory actuator V and a control unit C for controlling the vibratory actuator V. As shown in FIG. 12, the vibratory actuator V includes first and second substantially rectangular parallelepiped piezoelectric elements 12*a* and 12*b* of the type shown in FIGS. 2A and 2B (for example, with a length of 6.0 mm×a width of 1.7 mm×a thickness of 2.5 mm). Each of the piezoelectric elements 12*a* and 12*b* has a pair of opposed principle surfaces, a pair of opposed end surfaces which are perpendicular to the principle surfaces and extend in the lengthwise direction of each principle surface thereof, and a pair of opposed side surfaces which are perpendicular to both the principle and end surfaces and extend in the widthwise direction of each principle surface thereof. The principle, end and side surfaces form the outer surfaces of the piezoelectric elements 12*a* and 12*b*, and the end and side surfaces form the surrounding surfaces thereof. In this embodiment, the principle surfaces each have the largest area among the principle, end and side surfaces.

The piezoelectric elements 12*a* and 12*b* are aligned so that respective lengthwise directions (the movement direction of the movable body 9) of principle surfaces of the piezoelectric elements 12*a* and 12*b* coincide. Driver elements 8 are provided on one of the end surfaces of each of the piezoelectric elements 12*a* and 12*b* so that each of the driver elements 8 is located at a part corresponding to a loop of bending vibration wave. The driver elements 8 of the two piezoelectric elements 12*a* and 12*b* support a flat movable body 9. The driver elements 8 and the movable body 9 are formed of a ceramic material containing as a major component, for example, zirconia, alumina or silicon nitride. Precompression is applied to the other end surface of each of the piezoelectric elements 12*a* and 12*b* (which is the end surface opposite to the end surface on which the driver elements 8 are provided) and the driver elements 8 are pressed against the movable body 9. This press increases the friction force between the distal ends of the driver elements 8 and the movable body 9, whereby vibration of the piezoelectric elements 12*a* and 12*b* is reliably transmitted to the movable body 9 through the driver elements 8. Although not shown in FIG. 12, each of the piezoelectric elements 12*a* and 12*b* is contained inside a case and supported by the case with three supporting members interposed therebetween.

Each of the piezoelectric elements 12*a* and 12*b* is formed by alternately stacking substantially rectangular piezoelectric layers 1 and internal electrode layers 2. The piezoelectric layers 1 and the internal electrode layers 2 are the same as those in Embodiment 1. According to the present invention, first positive electrodes correspond to divided electrodes 3 of each of the positive electrode layers 2*a* provided in the areas A1 and A3, second positive electrodes correspond to divided electrodes 3 of each of the positive electrode layers 2*a* provided in the areas A2 and A4, first negative electrodes correspond to divided electrodes 3 of each of the negative electrode layers 2*b* provided in the areas A1 and A3 and second negative electrodes correspond to divided electrodes 3 of each of the negative electrode layers 2*b* provided in the areas A2 and A4.

The first and second piezoelectric elements 12*a* and 12*b* are electrically connected in series. Specifically, as shown in FIGS. 2A and 2B and FIG. 13, suppose that in each of the piezoelectric elements 12*a* and 12*b*, the external connecting electrodes 6 connected to the divided electrodes 3 of the positive electrode layers 2*a* provided in the areas A1 and A3 are A+, the external connecting electrodes 6 connected to the divided electrodes 3 of the positive electrode layers 2*a* provided in the areas A2 and A4 are B+, the external connecting electrodes 6 connected to the divided electrodes 3 of the negative electrode layers 2*b* provided in the areas A1 and A3 are A−, and the external connecting electrodes 6 connected to the divided electrodes 3 of the negative electrode layers 2*b* provided in the areas A2 and A4 are B−. A− of the first piezoelectric element 12*a* and A+ of the second piezoelectric element 12*b* are electrically connected to each other via an interconnect and B− of the first piezoelectric element 12*a* and B+ of the second piezoelectric element 12*b* are electrically connected to each other via an interconnect. That is, the divided electrodes 3 of the negative electrode layers 2*b* provided in the areas A1 and A3 in the first piezoelectric element 12*a* are electrically connected to the divided electrodes 3 of the positive electrode layers 2*a* provided in the areas A1 and A3 in the second piezoelectric element 12*b*, respectively, and the divided electrodes 3 of the negative electrode layers 2*b* provided in the areas A2 and A4 in the first piezoelectric element 12*a* are electrically connected to the divided electrodes 3 of the positive electrode layers 2*a* provided in the areas A2 and A4 in the second piezoelectric element 12*b*, respectively. A power supply, the divided electrodes 3 of the positive electrode layers 2*a* provided in the areas A1 and A3 in the first piezoelectric element 12*a*, the divided electrodes 3 of the negative electrode layers 2*b* provided in the areas A1 and A3 in the first piezoelectric element 12*a*, the divided electrodes 3 of the positive electrode layers 2*a* provided in the areas A1 and A3 in the second piezoelectric element 12*b*, the divided electrodes 3 of the negative electrode layers 2*b* provided in the areas A1 and A3 in the second piezoelectric element 12*b* and a ground are electrically connected in series in this order. A power supply, the divided electrodes 3 of the positive electrode layers 2*a* provided in the areas A2 and A4 in the first piezoelectric element 12*a*, the divided electrodes 3 of the negative electrode layers 2*b* provided in the areas A2 and A4 in the first piezoelectric element 12*a*, the divided electrodes 3 of the positive electrode layers 2*a* provided in the areas A2 and A4 in the second piezoelectric element 12b, the divided electrodes 3 of the negative electrode layers 2b provided in the areas A2 and A4 in the second piezoelectric element 12b and a ground are electrically connected in series in this order.

Resonance frequencies of stretching vibration and bending vibration of the piezoelectric elements 12a and 12b are determined by the material, shape and the like of the piezoelectric elements 12a and 12b. The material, shape and the like of the piezoelectric elements 12a and 12b are determined so that the resonance frequencies of stretching vibration and bending vibration substantially coincide. In this embodiment, the material, shape and the like of the piezoelectric elements 12a and 12b are determined so that the resonance frequency of the first mode of stretching vibration and the resonance frequency of the second mode of bending vibration coincide.

—Operation of Vibratory Actuator—

Hereafter, the operation of the vibratory actuator V will be described with reference to FIGS. 4 through 6.

For example, a reference AC voltage (for example, at a frequency of 270-300 kHz and a voltage of 5 Vrms, hereafter referred to as a "first voltage") which is a sine wave at a frequency around the resonance frequency is applied, via a wire (not shown), between A+ and A− of each of the piezoelectric elements 12a and 12b, i.e., between each of the divided electrodes 3 of each of the positive electrode layers 2a provided in the areas A1 and A3 and an associated one of the divided electrodes 3 of an associated one of the negative electrode layers 2b provided in the areas A1 and A3. In addition, an AC voltage (hereafter referred to as a "second voltage") which is a sine wave at substantially the same magnitude and the same frequency as that of the first voltage is applied, via a wire (not shown), between B+ and B− of each of the piezoelectric elements 12a and 12b, i.e., between each of the divided electrodes 3 of each of the positive electrode layers 2a provided in the areas A2 and A4 and an associated one of the divided electrodes 3 of each of the negative electrode layers 2b provided in the areas A2 and A4. Accordingly, a voltage having the same phase is applied to the divided electrodes 3 of the positive electrode layers 2a provided in the areas A1 and A3 and also a voltage having the same phase is applied to the divided electrodes 3 of the positive electrode layers 2a provided in the areas A2 and A4. As a result, if a phase difference between the first voltage and the second voltage is 0°, the first mode of stretching vibration of FIG. 4 is induced in each of the piezoelectric elements 12a and 12b and if the phase difference is 180°, the second mode of bending vibration of FIG. 5 is induced in the piezoelectric elements 12a and 12b.

When the first voltage in the form of a sine wave at a frequency around the resonance frequency is applied between A+ and A− of each of the piezoelectric elements 12a and 12b and the second voltage in the form of a sine wave having a phase shifted by 90° or −90° relative to the first voltage and having substantially the same magnitude and the same frequency is applied between B+ and B−, the first mode of stretching vibration of FIG. 4 and the second mode of bending vibration of FIG. 5 are induced in a cooperated manner in each of the piezoelectric elements 12a and 12b.

Then, the shape of each of the piezoelectric elements 12a and 12b varies in the order shown in FIGS. 6A through 6D. As a result, the driver elements 8 provided in each of the piezoelectric elements 12a and 12b make an elliptical motion when viewed in the direction normal to the shape the page in FIGS. 6A through 6D. That is, the elliptical motion of the driver elements 8 is made by composite vibration of stretching vibration and bending vibration of each of the piezoelectric elements 12a and 12b. This elliptical motion causes a relative motion of the movable body 9 supported by the driver elements 8 with the piezoelectric elements 12a and 12b, whereby the movable body 9 moves in the directions shown by arrows A and B of FIG. 12.

In this case, the stretching direction of stretching vibration is along the lengthwise direction of the principle surfaces of each of the piezoelectric element, i.e., the movement direction of the movable body 9. The vibration direction of bending vibration is along the direction in which the driver elements 8 support the movable body 9. The stacking direction of each of the piezoelectric elements 12a and 12b is perpendicular to each of the stretching direction of stretching vibration and the vibration direction of bending vibration.

—Control of Vibratory Actuator—

Hereafter, control of the vibratory actuator V will be described. FIG. 13 is a block diagram of a control unit C for the vibratory actuator V. A sine wave voltage at a predetermined frequency, which is generated from a frequency generator 21, is applied as the first voltage to the first and second piezoelectric elements 12a and 12b connected in series via a driver 22. A voltage generated from the frequency generator 21 is phase shifted by a phase difference generator 23 and is applied as the second voltage having the same frequency as the frequency of the first voltage and a phase shifted relative to the first voltage to the first and second piezoelectric elements 12a and 12b via a driver 24. A current and a voltage between A− of the first piezoelectric element 12a and A+ of the second piezoelectric element 12b, and a current and a voltage between B+ of the first piezoelectric element 12a and B− of the second piezoelectric element 12b, are detected by a current/voltage detector 25 and the current/voltage information is sent to a control section 26. The control section 26 determines, based on the current/voltage information from the current/voltage detector 25 and the like, the frequency of the first and second voltages and a phase difference between the first voltage and the second voltage and sends the frequency information to the frequency generator 21 and the phase difference information to the phase difference generator 23.

Figure 14:
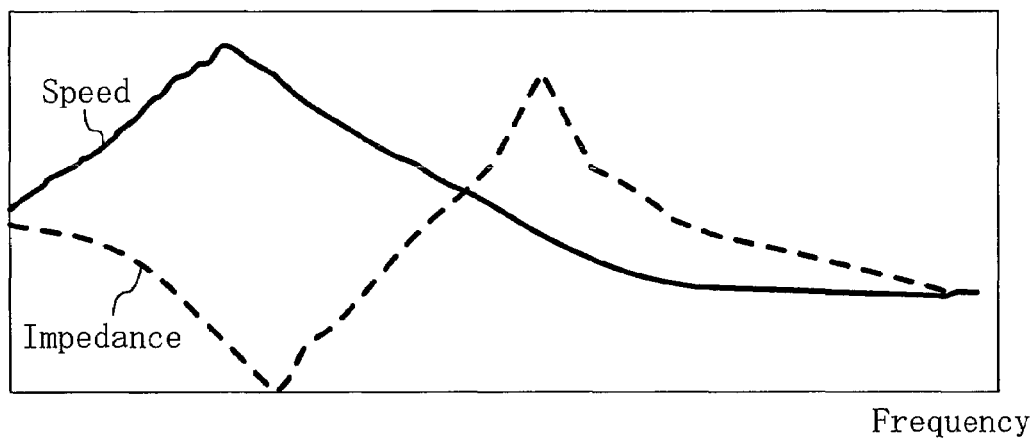
FIG. 14 is a graph showing characteristics of a piezoelectric element with respect to frequency.
Figure 15:
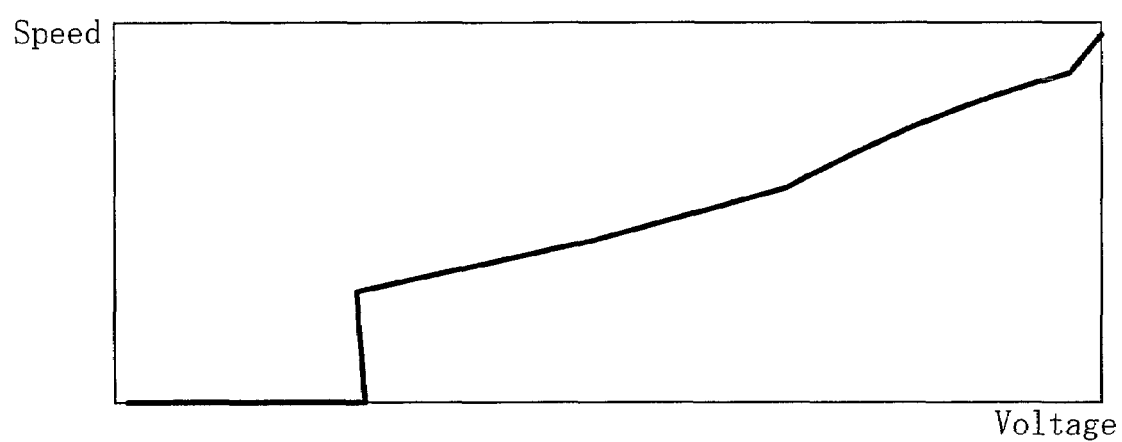
FIG. 15 is a graph showing characteristics of a piezoelectric element with respect to voltage.

FIG. 14 is a graph showing characteristics of a piezoelectric element with respect to frequency. The solid line representing characteristics of movement speed of a movable body with respect to frequency shows a spike with the resonance frequency centered. The dotted line representing characteristics of impedance of the piezoelectric element with respect to frequency exhibits the lowest impedance around a point where the movement speed of the movable body is the highest and is increased as the frequency is increased. In view of efficiency, the movement speed of the movable body is formed to be controlled by changing the frequency in a higher frequency range than the resonance frequency. FIG. 15 is a graph showing characteristics of the piezoelectric element with respect to voltage. This graph shows the frequency dependency of movement speed of the movable body in the case where the frequency of two different phase supply voltages is 270 kHz and a phase difference between the two supply voltages is 90°. When the power supply voltages are equal to or lower than a certain level, the movable body does not move and when the power supply voltages exceed the certain level, the movable body moves and the movement speed thereof is monotonously increased with respect to the power supply voltages. That is, the higher a voltage applied to the piezoelectric element is, the higher the movement speed at which the movable body moves. However, if an extremely high voltage is applied to the piezoelectric element, the displacement of the piezoelectric element becomes excessively large to exceed a destruction limit. In addition or in the alternative, an excessively large current flows in the piezoelectric element. This might result in excessive heat of the piezoelectric element to cause damage of the piezoelectric element. As has been described, each piezoelectric element exhibits characteristics shown by FIG. 14 and FIG. 15.

An absolute value of the resonance frequency of a piezoelectric element largely depends on outside dimensions thereof. For example, if a piezoelectric element having a length of 6.0 mm is desired to be fabricated but a piezoelectric element having a 0.10 mm different length from 6.0 mm is fabricated due to defects in fabrication, the absolute value is shifted by 4.4 kHz from that of a piezoelectric element having a length of 6.0 mm.

Suppose that a single movable body is driven by two piezoelectric elements. Even though the two piezoelectric elements have difference resonance frequencies due to variations in fabrication between the piezoelectric elements, the piezoelectric elements have to be operated in a cooperative manner.

In such case, an independent power supply source is prepared for each of the piezoelectric elements and the corresponding frequency of a voltage, phase difference, and the like are adjusted so that the piezoelectric elements exhibit the same characteristics. This reduces variations of characteristics, but the structure and control of the power supplies become complicated. On the other hand, if piezoelectric elements are connected in parallel, the structure of power supplies is simplified but variations of characteristics are caused and therefore increase in power corresponding to the increased number of piezoelectric elements can not be achieved.

Figure 16:
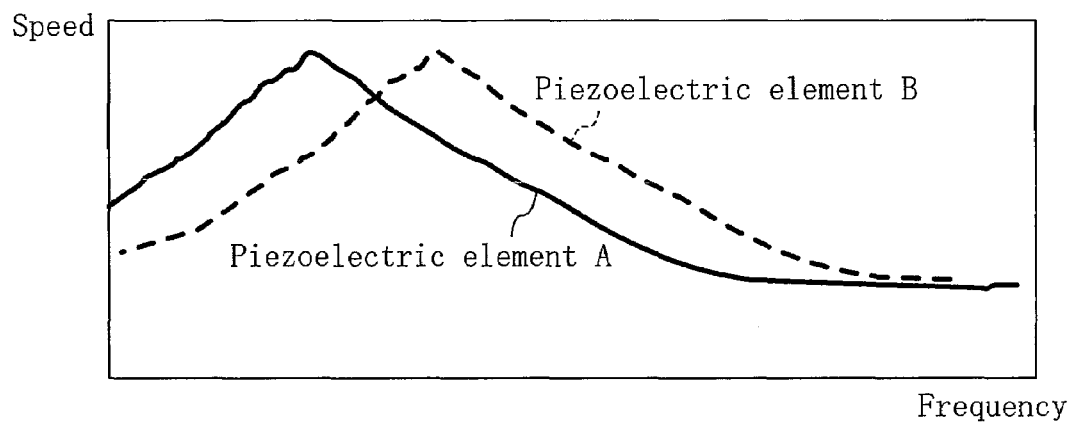
FIG. 16 is a graph showing characteristics of movement speed of a movable body with respect to frequency for two piezoelectric elements having different resonance frequencies.
Figure 17:
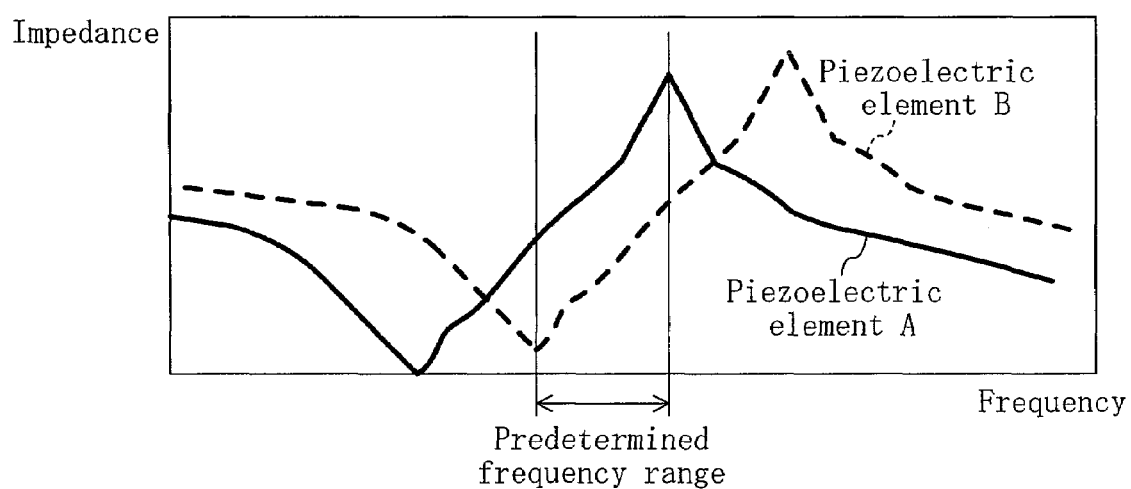
FIG. 17 is a graph showing characteristics of impedance with respect to frequency for two piezoelectric elements having different resonance frequencies.

FIG. 16 is a graph showing characteristics of movement speed of a movable body with respect to frequency in the case where two piezoelectric elements, designated as A and B, have different resonance frequencies. Since respective resonance frequencies of the piezoelectric elements A and B are different, a frequency at which the movement speed of the movable body reaches a peak differs between the piezoelectric elements A and B. Accordingly, if the two piezoelectric elements A and B are independently moved at the same frequency, the movement speed differs between the piezoelectric element A and the piezoelectric element B and the two piezoelectric elements A and B can not be efficiently operated in a cooperated manner. Characteristics of impedances of the two piezoelectric elements A and B with respective to frequency are shown in FIG. 17. When the two piezoelectric elements A and B are independently driven at the same frequency, the movement speed when a movable body is moved by the piezoelectric element B is higher than the movement speed when the movable body is moved by the piezoelectric element A. Accordingly, when a single movable body is moved by the two piezoelectric elements A and B, the piezoelectric element A becomes a load of the piezoelectric element B. However, if the two piezoelectric elements A and B are connected in series, the impedance of the piezoelectric element A is higher than the impedance of the piezoelectric element B and thus a larger voltage is applied to the piezoelectric element A than to the piezoelectric element B, so that the movement speed of the movable body when being moved by the piezoelectric element A and the movement speed of the movable body when being moved by the piezoelectric element B become substantially equal to each other.

As has been described, because of the characteristics of movement speed of the movable body 9 and the impedances with respect to frequency, even in the case where there are variations in characteristics of the first and second piezoelectric elements 12a and 12b with respect to frequency, the movement speed of the movable body 9 moved by the piezoelectric element A and the movement speed of the movable body 9 moved by the piezoelectric element B can be made to be substantially equal to each other, by connecting the first and second piezoelectric elements 12a and 12b in series, when the first and second piezoelectric elements 12a and 12b are driven at the same frequency. In this manner, according to this embodiment, the first and second piezoelectric elements 12a and 12b can be stably operated in a cooperated manner using the same power supply.

When the first and second piezoelectric elements 12a and 12b are connected in series, twice the magnitude of voltage, compared to that in the case where a voltage is individually applied to each of the piezoelectric elements 12a and 12b, is applied thereto. This is because the average impedance is doubled. However, a current is reduced by the half, compared to the case where a current individually flows in each of the piezoelectric elements 12a and 12b. Consequently, the power is equal in both cases. In this manner, when the first and second piezoelectric elements 12a and 12b are connected in series, twice the magnitude of voltage, compared to the case where a voltage is individually applied to each of the piezoelectric elements 12a and 12b, has to be applied thereto. Therefore, each of the piezoelectric elements 12a and 12b is formed not to have a single plate structure which requires a very large voltage, but rather to have a laminated structure.

In this embodiment, the piezoelectric element 12b is connected to a ground. With adoption of a full bridge structure, twice the magnitude of voltage can be substantially applied thereto.

The effects of this embodiment are markedly exhibited when each of frequencies of the first and second voltages is set to be in a predetermined frequency range which is higher than the higher resonance frequency (i.e., the highest resonance frequency) of the resonance frequencies (i.e., frequencies at which the lowest impedance is exhibited) of the piezoelectric elements 12a and 12b and lower than the lower antiresonance frequency (i.e., the lowest antiresonance frequency) of the antiresonance frequencies (i.e., frequencies at which the highest impedance is exhibited) of the piezoelectric elements 12a and 12b (see FIG. 17). This is because in the predetermined frequency range, as the frequency is increased, the movement speed is monotonously reduced and the impedance is monotonously increased. The frequency range is determined by detecting in advance the relevant characteristics of each of the piezoelectric elements 12a and 12b with respect to frequency. The frequencies of the first and second voltages may be merely set to be higher than the higher one of the resonance frequencies of the piezoelectric elements 12a and 12b, or may be merely set to be lower than the lower one of the antiresonance frequencies of the piezoelectric elements 12a and 12b. When the frequencies of the first and second voltages are controlled to be higher than the antiresonance frequency, the relationship between respective characteristics of impedance and movement speed with respect to frequency varies.

Furthermore, when the resonance frequency largely differs between the first and second piezoelectric elements 12a and 12b, there might be cases where the two piezoelectric elements 12a and 12b are driven with one of the impedances of the piezoelectric elements 12a and 12b being very low. To cope with this situation, current and voltage between the first and second piezoelectric elements 12a and 12b may be monitored by the current/voltage detector 25 and, when detected values are abnormal (for example, when a voltage value is around a power supply voltage or a ground), the frequencies of the first and second voltages are changed. Alternatively, current or voltage between the first and second piezoelectric elements 12*a* and 12*b* may be monitored and, when a detected value is abnormal, the frequencies of the first and second voltages may be changed.

Other Embodiments

In Embodiments 1 through 4, the internal electrode layers 2 are obtained by arranging a first positive electrode layer 2*aa*, a first negative electrode layer 2*ba*, a second positive electrode layer 2*ab* and a second negative electrode layer 2*bb* in this order in the stacking direction with each of the piezoelectric layers 1 interposed between an associated one of the electrode layers. However, the structure of the internal electrode layers 2 is not limited thereto. Several first positive electrode layers 2*aa* or several second positive electrode layers 2*ab* may be continuously provided in the stacking direction and several first negative electrode layers 2*ba* or several second negative electrode layers 2*bb* may be continuously provided in the stacking direction. As another option, first positive electrode layers 2*aa* and second positive electrode layers 2*ab* may be randomly provided, and first negative electrode layers 2*ba* and second negative electrode layers 2*bb* may be randomly provided.

In Embodiments 1 through 4, the shape which the divided electrodes 3 and the connecting electrode 4 of each of the internal electrode layers 2 form may be symmetrical with respective to a center point M (see FIG. 3) of an upper principle surface of an associated one of the piezoelectric layers 1. That is, the shape of each of the internal electrode layers 2, excluding the lead electrodes 5, may be symmetrical with respect to an intersecting point of the first diagonal line and the second diagonal line on the upper principle surface of an associated one of the piezoelectric layers 1. As described above, by forming each of the internal electrode layers 2 into a substantially symmetrical shape with respect to the center point M on the upper principle surface of an associated one of the piezoelectric layers 1, symmetrical properties of vibration, specifically, the second mode of bending vibration of the piezoelectric element 12 is improved. Accordingly, excessive vibration does not occur in the piezoelectric element 12 and energy loss can be largely reduced. As a result, supplied power can be efficiently converted into vibration.

In Embodiments 1 through 4, the shape which the divided electrodes 3 and the connecting electrode 4 of each of the first positive electrode layers 2*aa* form may be an inverted shape of the shape which the divided electrodes 3 and the connecting electrode 4 of each of the second positive electrode layers 2*ab* form with respect to a center line C (see FIG. 3) extending in the lengthwise direction L of an upper principle surface of each of the piezoelectric layers 1. The shape which the divided electrodes 3 and the connecting electrode 4 of each of the first negative electrode layers 2*ba* form may be an inverted shape of the shape which the divided electrodes 3 and the connecting electrode 4 of each of the second negative electrode layers 2*bb* with respect to the center line C. That is, the respective shapes of each of the first positive electrode layers 2*aa* and each of the first negative electrode layers 2*ba*, excluding the lead electrodes 5, may be inverted with respect to the center line C to obtain the respective shape of each of the second positive electrode layers 2*ab* and each of the second negative electrode layers 2*bb*, respectively. In this manner, the shape of each of the first positive electrode layers 2*aa* is made to be a substantially inverted shape of the shape of each of the second positive electrode layers 2*ab* with respect to the center line C, and the shape of each of the first negative electrode layers 2*ba* is made to be a substantially inverted shape of the shape of each of the second negative electrode layers 2*bb* with respect to the center line C, thereby improving symmetrical properties of vibration, specifically, the second mode of bending vibration of the piezoelectric element 12. Accordingly, excessive vibration does not occur in the piezoelectric element 12 and energy loss can be largely reduced. As a result, supplied power can be efficiently converted into vibration.

Figure 18A:
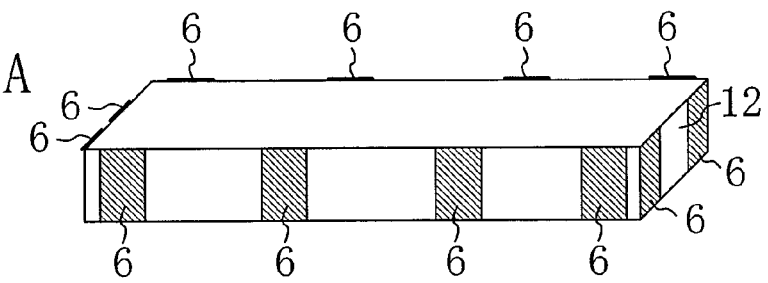
FIG. 18A is a perspective view of a piezoelectric element.
Figure 18B:
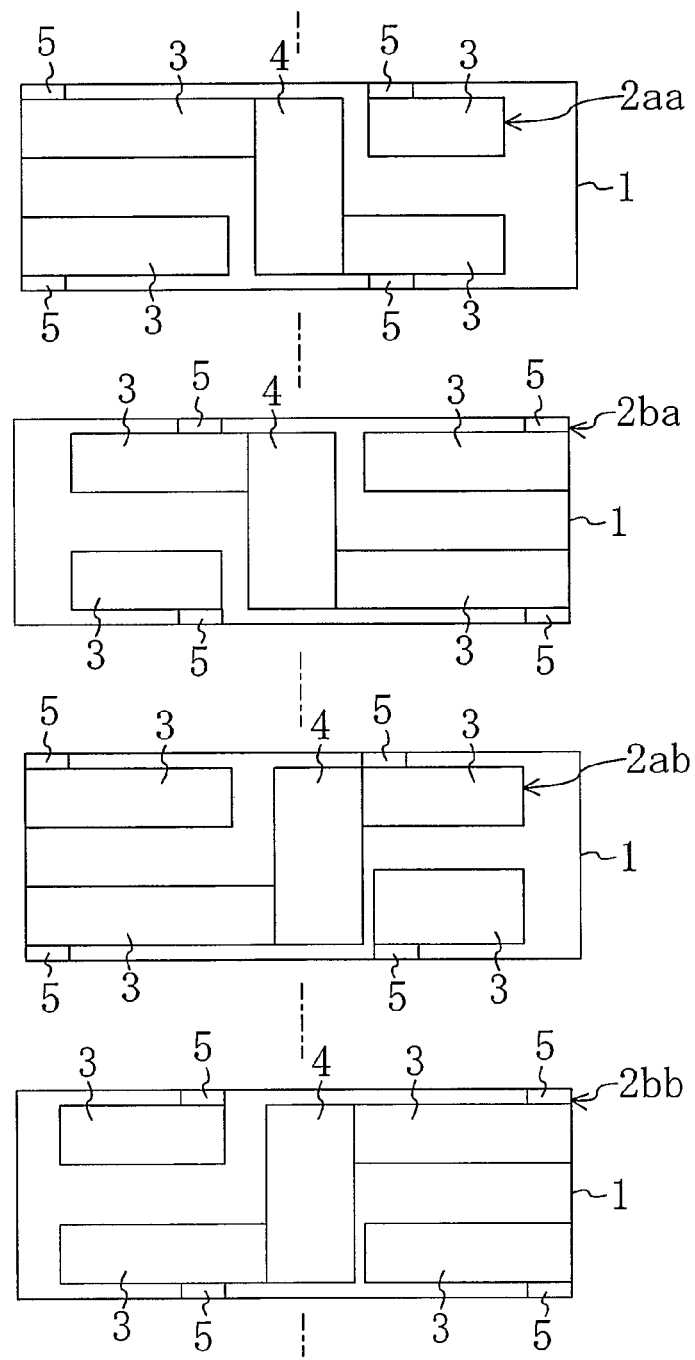
FIG. 18B is a plan views of piezoelectric layers with electrode layers provided on their respective upper principle surfaces, respectively.

Moreover, in Embodiments 1 through 4, as exemplified in FIGS. 18A and 18B, the divided electrodes 3 may be formed so that parts of the divided electrodes 3 of each of the positive electrode layers 2*a* and parts of the divided electrodes 3 of each of the negative electrode layers 2*b* which overlap with one another in the stacking direction are located in other parts of each of the piezoelectric layers 1 than both marginal portions in the lengthwise direction of the piezoelectric layer 1.

Each of the marginal portions in the lengthwise direction of each of the piezoelectric layers 1 is located distant from a part in which stress of the first mode of stretching vibration concentrates and, thus, stress is hardly generated in the marginal portions. If an electrode is formed in the marginal portions in which stress is hardly generated, power supplied through the electrode can not be efficiently converted into vibration and electrical loss can be easily caused. Therefore, as described above, in order to efficiently convert supplied power into vibration, it is effective to form an electrode in or near the part in which stress of stretching vibration concentrates and not to form an electrode in other parts where large stress is not caused. Specifically, each of the overlapping parts is preferably provided in parts other than part of the associated one of the piezoelectric layers 1 extending from a marginal portion in the lengthwise direction toward the center point of the piezoelectric layer 1 in the lengthwise direction by a length corresponding to 10%, more preferably, 20% of a length of the piezoelectric layer 1. Thus, larger first mode stretching vibration can be induced, thereby improving the efficiency of the vibratory actuator V.

In Embodiments 1 through 4, each of the overlapping parts may be provided in a part of the associated one of the piezoelectric layers 1 other than a center part thereof in the widthwise direction.

The center part of each of the piezoelectric layers 1 in the widthwise direction is located distant from a part (i.e., marginal portions in the widthwise direction of each of the piezoelectric layers 1) in which stress of the second mode of bending vibration concentrates and, thus, stress is hardly generated in the marginal portions. If an electrode is formed in the marginal portions in which stress is hardly generated, power supplied through the electrode can not be efficiently converted into vibration and electrical loss can be easily caused. Therefore, as described above, in order to efficiently convert supplied power into vibration, it is effective to form an electrode in or near the part in which stress of bending vibration concentrates and not to form an electrode in other part in which stress is hardly generated. Specifically, each of the overlapping parts is preferably provided in a part other than a part of the associated one of the piezoelectric layers 1 extending from the center point in the widthwise direction toward the marginal portions of the piezoelectric layer 1 in the widthwise direction by a length corresponding to 10%, more preferably, 20% of a width of the piezoelectric layer 1. Thus, larger second mode bending vibration can be induced, thereby improving the efficiency of the vibratory actuator V.

In Embodiments 1 through 4, the connecting electrode 4 may be provided to extend substantially over an entire center part of each of the piezoelectric layers 1 in the lengthwise direction, excluding both marginal portions in the widthwise direction. Thus, the area of an electrode provided in the center part of the piezoelectric layer 1 can be increased. The center part of each of the piezoelectric layers 1 is a node portion of the first mode of stretching vibration, i.e., a part in which stress of stretching vibration concentrates, and electric charges due to the piezoelectric effect are intensively generated in the stress concentration part. As described above, even when the size of the piezoelectric element 12 is reduced, large stretching vibration can be induced by increasing the area of an electrode provided in the stress concentration part. As a result, the efficiency of the vibratory actuator V can be improved.

The larger the area of the connecting electrode 4 becomes, the larger generated stretching vibration becomes. However, when the area of the connecting electrode 4 is too large, the second mode of bending vibration is prevented. Therefore, the width of the connecting electrode 4 is preferably determined to be 5% to 40% of a length of each of the piezoelectric layers 1.

On the other hand, the connecting electrode 4 is ideally formed to extend substantially from one edge to the other edge in an associated one of the piezoelectric layers 1 in the widthwise direction. However, if the connecting electrode 4 is formed to reach marginal portions of each of the piezoelectric layers 1 in the widthwise direction, it is difficult to provide insulation between the internal electrode layers 2. Therefore, as described above, it is effective to form the connecting electrode 4 to extend over part of an associated one of the piezoelectric layers 1 in the widthwise direction, excluding the marginal portions of the piezoelectric layer 1 in the widthwise direction. Specifically, the connecting electrode 4 is preferably formed over the center part of each of the piezoelectric layers 1 in the lengthwise direction so as not to be provided over part of an associated one of the piezoelectric layers 1 extending from each marginal portion of the piezoelectric layer 1 in the widthwise direction to the center part thereof in the widthwise direction by a length corresponding to a thickness of the piezoelectric layer 1.

In Embodiments 1 through 4, the divided electrodes 3 are substantially rectangular electrodes. However, the divided electrodes 3 are not limited thereto. For example, the divided electrodes 3 may be formed so that each of the divided electrodes 3 has a corresponding shape to the distribution of stress due to vibration.

In Embodiments 1 through 4, a power supply method using wires has been described. However, some other power supply method such as a method for supplying power using conductive rubber, a flexible substrate, contact pins or the like may be used. Even when such a power supply method is used, the same effects as those of Embodiments 1 through 4 can be achieved.

Figure 19:
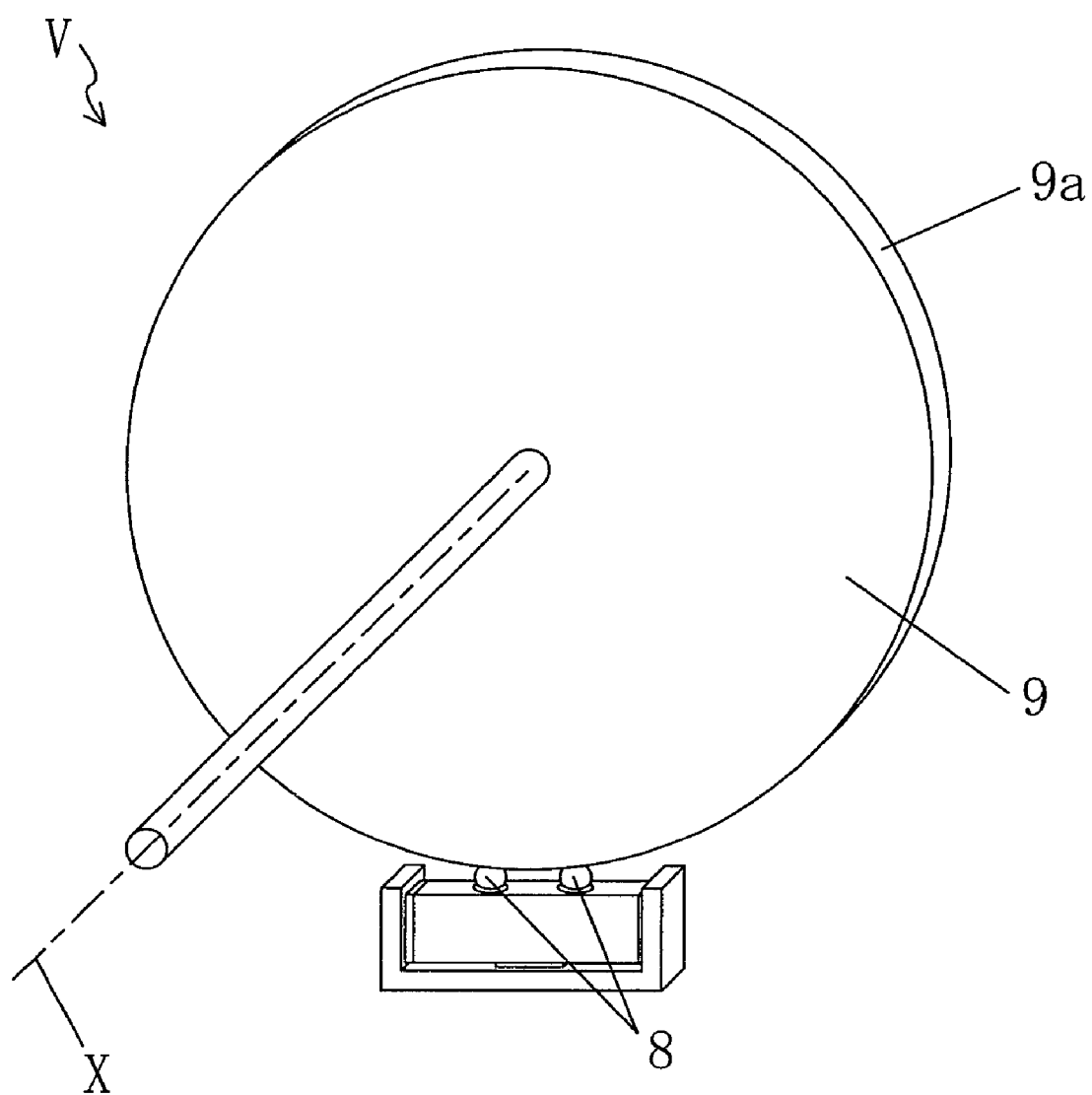
FIG. 19 is a perspective view of a modified example of an inventive vibratory actuator.

In Embodiments 1 through 4, the movable body 9 driven by application of a driving force of the vibratory actuator V has a flat shape. However, the shape of the movable body 9 is not limited thereto. An arbitrary structure of the movable body 9 may be adopted. For example, as shown in FIG. 19, the movable body 9 may be formed to be a circular disc-shaped object 9 capable of rotating around a predetermined axis X such that the driver elements 8 of the vibratory actuator V are brought in contact with a side peripheral surface 9a of the disc-shaped object 9. With this structure, when the vibratory actuator V is driven, the disc-shaped object 9 is rotated around the predetermined axis X by the elliptical motion of the driver elements 8.

In Embodiments 1 through 4, the structure in which the driver elements 8 are provided only in one end surface of the piezoelectric element 12 has been described. However, the driver elements 8 may be formed on one side surface of the piezoelectric element 12. In that case, the stretching direction of the first mode of stretching vibration is along the direction in which the driver elements 8 support the movable body 9 and the vibration direction of the second mode of bending vibration is along the movement direction of the movable body 9.

In Embodiments 1 through 4, the phase difference between the first voltage and the second voltage is 90°. However, the phase difference between the first and second voltages may be a different angle, as long as the phase difference is not 0°. By controlling the phase difference, the speed of the movable body 9 can be controlled.

In Embodiments 1 through 4, each of the piezoelectric layers 1 is polarized from an associated one of the positive electrode layers 2a to an associated one of the negative electrode layers 2b. However, each of the piezoelectric layers 1 may be polarized from an associated one of the negative electrode layers 2b to an associated one of the positive electrode layers 2a. This is because the internal electrode layers 2 are formed by alternately arranging two different electrode layers in the stacking direction with each of the piezoelectric layers 1 interposed between associated ones of the electrode layers and one type of the two different electrodes is referred to herein as the "positive electrode layers 2a" and the other type of the two different electrodes is referred to herein as the "negative electrode layers 2b" for convenience. It should be noted that there is no intention to define "positive electrode layers 2a" as feeding electrode layers and "negative electrode layers 2b" as ground electrode layers by using the terms "positive" and "negative".

In Embodiment 4, it has been described that the movable body 9 is supported by the driver elements 8 of the first and second piezoelectric elements 12a and 12b and the piezoelectric elements 12a and 12b are connected in series. The same effects as those of Embodiment 4 can be also achieved even when the movable body 9 is supported by the driver elements 8 of three or more piezoelectric elements 12 and the piezoelectric elements 12 are connected in series. That is, first through nth piezoelectric elements 12 (where n is an arbitrary integer of 3 or more) may be prepared in such a manner that divided electrodes 3 provided in areas A1 and A3 of a negative electrode layer 2b of the first piezoelectric element 12, divided electrodes 3 provided in areas A1 and A3 of a positive electrode layer 2a of the second piezoelectric element 12, divided electrodes 3 provided in areas A1 and A3 of a negative electrode layer 2b of the second piezoelectric element 12, divided electrodes 3 provided in areas A1 and A3 of a positive electrode layer 2a of the third piezoelectric element 12, . . . , divided electrodes 3 provided in areas A1 and A3 of a negative electrode layer 2b of the n−1th piezoelectric element 12 and divided electrodes 3 provided in areas A1 and A3 of a positive electrode layer 2a of the nth piezoelectric element 12 are electrically connected and divided electrodes 3 provided in areas A2 and A4 of a negative electrode layer 2b of the first piezoelectric element 12, divided electrodes 3 provided in areas A2 and A4 of a positive electrode layer 2a of the second piezoelectric element 12, divided electrodes 3 provided in areas A2 and A4 of a negative electrode layer 2b of the second piezoelectric element 12, divided electrodes 3 provided in areas A2 and A4 of a positive electrode layer 2a of the third piezoelectric element 12, . . . , divided electrodes 3 provided in areas A2 and A4 of a negative electrode layer 2b of the n−1th piezoelectric element 12 and divided electrodes 3 provided in areas A2 and A4 of a positive electrode layer 2a of the nth piezoelectric element 12 are electrically connected.

In the description above, first negative electrodes of the ith piezoelectric element 12 (where i=1, . . . , i=n−1) are electrically connected to first positive electrodes of the (i+1)th piezoelectric element 12, respectively, and second negative electrodes of the ith piezoelectric element 12 are electrically connected to second positive electrodes of the (i+1)th piezoelectric element 12, respectively. That is, any arrangement may be adopted as long as electrodes of the ith piezoelectric element 12 to which the first voltage is applied are electrically connected to electrodes of the (i+1)th piezoelectric element 12 to which the first voltage is applied, respectively, and electrodes of the ith piezoelectric element 12 to which the second voltage is applied are electrically connected to electrodes of the (i+1)th piezoelectric element 12 to which the second voltage is applied, respectively. In this manner, if electrodes of the ith piezoelectric element 12 to which the first voltage is applied are electrically connected to electrodes of the (i+1)th piezoelectric element 12 to which the first voltage is applied, respectively, and electrodes of the ith piezoelectric element 12 to which the second voltage is applied are electrically connected to electrodes of the (i+1)th piezoelectric element 12 to which the second voltage is applied, respectively, the electrodes of the (i+1)th piezoelectric element 12 which are electrically connected to the first negative electrodes of the ith piezoelectric element 12 serve as first positive electrodes and the electrodes of the (i+1) piezoelectric element 12 which are electrically connected to the second negative electrodes of the ith piezoelectric element 12 serve as second positive electrodes.

In Embodiment 4, the divided electrodes 3 of the positive electrode layer 2a provided in the areas A1 and A3 are first positive electrodes, the divided electrodes 3 of the positive electrode layer 2a provided in the areas A2 and A4 are second positive electrodes, the divided electrodes 3 of the negative electrode layer 2b provided in the areas A1 and A3 are first negative electrodes and the divided electrodes 3 of the negative electrode layer 2b provided in the areas A2 and A4 are second negative electrodes. However, as long as the first negative electrodes are provided so that each of the first negative electrodes is opposed to an associated one of the first positive electrodes with an associated one of the piezoelectric layers 1 interposed therebetween and the first voltage is supplied between each of the first negative electrodes and an associated one of the first positive electrodes and the second negative electrodes are provided so that each of the second negative electrodes is opposed to an associated one of the second positive electrodes with an associated one of the piezoelectric layers 1 interposed therebetween, the second voltage is supplied between each of the second negative electrodes and an associated one of the second positive electrodes and the second negative electrodes are not electrically connected to the first negative electrodes, the structure including the first positive electrodes, the second positive electrodes, the first negative electrodes and the second negative electrodes is not limited to the above-described structure.

The present invention is not limited to the above-described embodiments and may be embodied in various other forms without departing from the spirit or essential character thereof.

Thus, the above-described embodiments are merely examples in all respects and must not be construed to limit the invention. The scope of the present invention is defined by the scope of the claims of the present invention and is not limited at all by the specific description of this specification. Furthermore, all the modifications and changes belonging to equivalents of the claims are considered to fall within the scope of the present invention.

As has been described, a piezoelectric element, a vibratory actuator and driving unit according to the present invention allow full bridge driving and improve the reliability.

What is claimed is:

1. A piezoelectric element formed by alternately stacking substantially rectangular piezoelectric layers and internal electrode layers,
   wherein the internal electrode layers are positive electrode layers and negative electrode layers which are alternately arranged in a stacking direction with each of the piezoelectric layers interposed between an associated one of the positive electrode layers and an associated one of the negative electrode layers,
   the positive electrode layers include a first positive electrode layer provided on a principle surface of one of the piezoelectric layers and a second positive electrode layer provided on a principle surface of different one of the piezoelectric layers from the one of the piezoelectric layers in which the first positive electrode layer is provided,
   the negative electrode layers include a first negative electrode layer provided on a principle surface of one of the piezoelectric layers and a second negative electrode layer provided on a principle surface of different one of the piezoelectric layers from the one of the piezoelectric layers in which the first negative electrode layer is provided,
   each of the first positive electrode layer and the first negative electrode layer includes four divided electrodes provided in four areas, respectively, the four areas being obtained by dividing a principle surface of an associated one of the piezoelectric layers into two areas in a lengthwise direction and two areas in a widthwise direction, and a connecting electrode for connecting a pair of the divided electrodes formed on diagonally opposite two of the four areas along a first diagonal direction on the principle surface of the associated one of the piezoelectric layers, and
   each of the second positive electrode layer and the second negative electrode layer includes four divided electrodes provided in the four areas, respectively, and a connecting electrode for connecting a pair of the divided electrodes formed on diagonally opposite two of the four areas along a second diagonal direction on the principle surface of the associated one of the piezoelectric layers.

2. The piezoelectric element of claim 1, wherein the internal electrode layers are provided in the manner that the first positive electrode layer, the first negative electrode layer, the second positive electrode layer and the second negative electrode layer are arranged in this order in the stacking direction with each of the piezoelectric layers interposed between associated ones of the electrode layers.

3. The piezoelectric element of claim 1, wherein each outermost layer of the piezoelectric element in the stacking direction is one of the piezoelectric layers.

4. A vibratory actuator comprising:
   the piezoelectric element of claim 1;
   a driver element provided on the piezoelectric element; and
   a movable body supported by the driver element,
   wherein power is supplied to the piezoelectric element to cause the piezoelectric element to make composite vibration of stretching vibration and bending vibration so that the driver element makes a substantially elliptical motion due to the composite vibration, thereby moving the movable body.

5. A drive unit comprising:
- a vibratory actuator including a plurality of piezoelectric elements, driver elements provided on the piezoelectric elements and a single movable body supported by the driver elements of the piezoelectric elements; and
- a control unit for supplying a first voltage and a second voltage having a same frequency as a frequency of the first voltage and a shifted phase relative to a phase of the first voltage to each of the piezoelectric elements to cause each of the piezoelectric elements to make composite vibration of stretching vibration and bending vibration so that the driver element makes a substantially elliptical motion due to the composite vibration, thereby moving the movable body,
- wherein the vibratory actuator includes first through nth piezoelectric elements, where n is an arbitrary integer of 2 or more, as the plurality of piezoelectric elements,
- each of the piezoelectric elements is formed by alternately stacking piezoelectric layers and internal electrode layers,
- the internal electrode layers are positive electrode layers and negative electrode layers which are alternately arranged in a stacking direction with each of the piezoelectric layers interposed between an associated one of the positive electrode layers and an associated one of the negative electrode layers,
- each of the positive electrode layers includes first positive electrodes and second positive electrodes,
- each of the negative electrode layers includes first negative electrodes provided so that each of the first negative electrodes is opposed to an associated one of the first positive electrodes with an associated one of the piezoelectric layers interposed therebetween and the first voltage is supplied between each of the first negative electrodes and an associated one of the first positive electrodes and second negative electrodes provided so that each of the second negative electrodes is opposed to an associated one of the second positive electrodes with an associated one of the piezoelectric layers interposed therebetween, the second voltage is supplied between each of the second negative electrodes and an associated one of the second positive electrodes and the second negative electrodes are not electrically connected to the first negative electrodes,
- a first negative electrode of an ith piezoelectric element, where i=1, ... and i=n−1, and a first positive electrode of an (i+1)th piezoelectric element are electrically connected to each other, and
- a second negative electrode of the ith piezoelectric element and a second positive electrode of the (i+1)th piezoelectric element are electrically connected to each other.

6. The drive unit of claim 5, wherein the control unit is so configured to set respective frequencies of the first and second voltages to be higher than highest one of respective resonance frequencies of the piezoelectric elements.

7. The drive unit of claim 5, wherein the control unit is so configured to set respective frequencies of the first and second voltages to be lower than lowest one of respective antiresonance frequencies the piezoelectric elements.

8. The drive unit of claim 5, wherein the control unit detects at least one of a current and a voltage between the first negative electrode of the ith piezoelectric element and the first positive electrode of the (i+1)th piezoelectric element and at least one of a current and a voltage between the second negative electrode of the ith piezoelectric element and the second positive electrode of the (i+1)th piezoelectric element and changes the respective frequencies of the first and second voltages, based on values obtained by the detection.

* * * * *